(12) United States Patent
Hu

(10) Patent No.: US 8,008,688 B2
(45) Date of Patent: *Aug. 30, 2011

(54) PHOTODIODE AND METHOD OF FABRICATION

(75) Inventor: Syn-Yem Hu, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 448 days.

This patent is subject to a terminal disclaimer.

(21) Appl. No.: 12/060,342

(22) Filed: Apr. 1, 2008

(65) Prior Publication Data

US 2009/0242934 A1    Oct. 1, 2009

(51) Int. Cl.
*H01L 31/07* (2006.01)
(52) U.S. Cl. .......................... 257/186; 438/91
(58) Field of Classification Search .................. 257/186; 438/91
See application file for complete search history.

(56) References Cited

U.S. PATENT DOCUMENTS

| | | | |
|---|---|---|---|
| 4,258,375 A | 3/1981 | Hsieh et al. | 257/186 |
| 5,001,335 A | 3/1991 | Takaoka et al. | 257/199 |
| 5,157,473 A | 10/1992 | Okazaki | 257/438 |
| 5,543,629 A | 8/1996 | Nakamura et al. | 257/21 |
| 5,610,416 A | 3/1997 | Su et al. | 257/186 |
| 5,712,504 A | 1/1998 | Yano et al. | 257/452 |
| 5,843,804 A | 12/1998 | Su et al. | 438/91 |
| 5,866,936 A | 2/1999 | Hasnain et al. | 257/452 |
| 6,229,162 B1 | 5/2001 | Watanabe | 257/186 |
| 6,518,080 B2 | 2/2003 | Bentell et al. | 438/34 |
| 6,589,848 B1 | 7/2003 | Hwang et al. | 438/319 |
| 6,706,542 B1 | 3/2004 | Geva et al. | 438/7 |
| 6,730,979 B2 | 5/2004 | Boisvert | 257/438 |
| 6,753,214 B1 | 6/2004 | Brinkmann et al. | 438/184 |
| 6,756,613 B2 | 6/2004 | Yuan | 257/186 |
| 6,800,914 B2 | 10/2004 | Ito et al. | 257/438 |
| 6,812,059 B2 | 11/2004 | Kang et al. | 438/57 |
| 6,885,075 B2 | 4/2005 | Kuhara et al. | 257/431 |
| 6,936,868 B2 | 8/2005 | Hiraoka et al. | 257/186 |
| 7,020,375 B2 | 3/2006 | Nakaji et al. | 385/131 |
| 7,031,587 B2 | 4/2006 | Nakaji et al. | 385/131 |
| 7,038,251 B2 | 5/2006 | Ishimura et al. | 257/186 |
| 7,105,369 B2 | 9/2006 | Yuan | 438/39 |
| 7,187,013 B2 | 3/2007 | Nakaji et al. | 257/186 |

(Continued)

OTHER PUBLICATIONS

"Simple Planar Structure for High-Performance AlInAs Avalanche photodiodes" by Yagyu, et al., IEEE Photonics Technology Letters, 2006, vol. 18, pp. 76-78.

(Continued)

*Primary Examiner* — Ha Tran T Nguyen
*Assistant Examiner* — Shaun Campbell
(74) *Attorney, Agent, or Firm* — Matthew A. Pequignot; Pequignot + Myers LLC

(57) ABSTRACT

The present invention provides a highly reliable photodiode, as well as a simple method of fabricating such a photodiode. During fabrication of the photodiode, a grading layer is epitaxially grown on a top surface of an absorption layer, and a blocking layer, for inhibiting current flow, is epitaxially grown on a top surface of the grading layer. The blocking layer is then etched to expose a window region of the top surface of the grading layer. Thus, the etched blocking layer defines an active region of the absorption layer. A window layer is epitaxially regrown on a top surface of the blocking layer and on the window region of the top surface of the grading layer, and is then etched to form a window mesa.

28 Claims, 16 Drawing Sheets

U.S. PATENT DOCUMENTS

| | | | |
|---|---|---|---|
| 7,259,408 B2 | 8/2007 | Yagyu et al. | 257/186 |
| 7,282,428 B2 | 10/2007 | Inada | 438/559 |
| 2004/0251483 A1 | 12/2004 | Ko et al. | 257/292 |
| 2005/0156192 A1 | 7/2005 | Ko et al. | 257/186 |
| 2005/0224839 A1 | 10/2005 | Yagyu et al. | 257/199 |
| 2005/0230706 A1 | 10/2005 | Yagyu et al. | 257/186 |
| 2009/0242933 A1* | 10/2009 | Hu et al. | 257/186 |

OTHER PUBLICATIONS

"A New Planar InGaAs—InAlAs Avalanche Photodiode" by Levine, et al., IEEE Photonics Technology Letters, 2006, vol. 18, pp. 1898-1900.

"High-Speed, High-Reliability Planar-Structure Superlattice Avalanche Photodiodes for 10-Gb/s Optical Receivers" by Watanabe, et al., Journal of Lightwave Technology, 2000, vol. 18, pp. 2200-2207.

"Microlens-Integrated Large-Area InAlGaAs—InAlAs Superlattice APD's for Eye-Safety 1.5-μm Wavelength Optical Measurement Use" by Hayashi, et al., IEEE Photonics Technology Letters, 1998, vol. 10, pp. 576-578.

"Buried-Mesa Avalanche Photodiodes" by Hasnain, et al., IEEE Journal of Quantum Electronics, 1998, vol. 34, pp. 2321-2326.

"High-Reliability and Low-Dark-Current 10-Gb/s Planar Superlattice Avalanche Photodiodes" by Watanabe, et al., IEEE Photonics Technology Letters, 1997, vol. 9, pp. 1619-162.

"A New Planar-Structure InAlGaAs—InAlAs Superlattice Avalanche Photodiode with a Ti-Implanted Guard-Ring" by Watanabe, et al., IEEE Photonics Technology Letters, 1996, vol. 8, pp. 827-829.

"High-Speed and Low-Dark-Current Flip-Chip InAlAs/InAlGaAs Quaternary Well Superlattice APDs with 120 GHz Gain-Bandwidth Product" by Watanabe, et al., IEEE Photonics Technology Letters, 1993, vol. 5, pp. 675-677.

"High-Speed Flip-Chip InP/InGaAs Avalanche Photodiodes with Ultralow Capacitance and Large Gain-Bandwidth Products" by Kito, et al., IEEE Photonics Technology Letters, 1991, vol. 3, pp. 1115-1116.

* cited by examiner

PHOTODIODE AND METHOD OF FABRICATION

TECHNICAL FIELD

The present invention relates to photodetectors and, in particular, to positive-intrinsic-negative (PIN) photodiodes and avalanche photodiodes (APDs).

BACKGROUND OF THE INVENTION

In optical communication systems, photodetectors are used to convert optical signals into electrical signals. The most commonly used photodetectors are positive-intrinsic-negative (PIN) photodiodes and avalanche photodiodes (APDs).

A typical PIN photodiode includes an absorption layer of intrinsic, i.e. not intentionally doped, semiconductor material between a region of extrinsic, i.e. doped, semiconductor material of a first conductivity type, i.e. n-type or p-type, and a region of extrinsic semiconductor material of a second conductivity type, i.e. p-type or n-type, an arrangement that produces an electric field in the absorption layer. In operation in photoconductive mode, a reverse voltage is applied to the PIN photodiode to enhance the electric field in the absorption layer. Light incident on the PIN photodiode is absorbed by the absorption layer to generate current carriers, i.e. electrons and holes, in an absorption process. The generated current carriers are separated by the electric field in the absorption layer and drift toward the regions of extrinsic semiconductor material: holes drift toward the region of p-type semiconductor material, and electrons drift toward the region of n-type semiconductor material. The resulting photocurrent is proportional to the optical power of the incident light.

A typical APD includes a multiplication layer of intrinsic or lightly doped extrinsic semiconductor material, in addition to an absorption layer of intrinsic semiconductor material, between a region of extrinsic semiconductor material of the first conductivity type and a region of extrinsic semiconductor material of the second conductivity type, an arrangement that produces electric fields in the multiplication layer and the absorption layer. In operation, a large reverse voltage is applied to the APD to enhance the electric fields in the absorption layer and the multiplication layer. As in the PIN photodiode, light incident on the APD is absorbed by the absorption layer to generate current carriers, in an absorption process. The generated current carriers are separated by the electric field in the absorption layer, such that either holes or electrons drift toward the multiplication layer. The electric field in the multiplication layer is large enough that the holes or electrons acquire sufficient kinetic energy to generate additional current carriers through impact ionization. The generated current carriers, in turn, generate additional current carriers through impact ionization. Thus, current carriers are multiplied in an avalanche multiplication process in the multiplication layer, leading to a multiplied photocurrent.

The absorption layer of PIN photodiodes, and the absorption and multiplication layers of APDs are active layers of primary importance to device operation, as the absorption and avalanche multiplication processes responsible for the photocurrent occur predominantly in active regions of these active layers. However, many conventional methods of fabricating PIN photodiodes and APDs include steps that may introduce defects into an active region of an active layer. For example, during fabrication of PIN photodiodes and APDs having a mesa configuration, a mesa may be etched through an active layer to define an active region. During fabrication of PIN photodiodes and APDs having a planar configuration, dopant diffusion into an active layer may be used to define an active region. Alternatively, during fabrication of PIN photodiodes and APDs having a planar configuration, ion implantation into an active layer may be used to define an active region.

In attempts to achieve PIN photodiodes and APDs with improved performance characteristics, fabrication methods have been developed that avoid modification of an active region of an active layer, for example, through etching, dopant diffusion, or ion implantation.

During fabrication of PIN photodiodes and APDs having a planar configuration, a grading or buffer layer may be formed on an active layer, and dopant diffusion into a layer above the grading or buffer layer may be used to define an active region, as disclosed in an article entitled "Simple Planar Structure for High-Performance AlInAs Avalanche photodiodes" by Yagyu, et al. (IEEE Photonics Technology Letters, 2006, Vol. 18, pp. 76-78), in U.S. Pat. No. 5,001,335 to Takaoka, et al., in U.S. Patent Application No. 2005/0156192 to Ko, et al., and in U.S. Patent Application No. 2004/0251483 to Ko, et al. However, dopant diffusion can induce redistribution of doping profiles in epitaxially grown layers, such as the grading or buffer layer and the active layer.

During fabrication of PIN photodiodes and APDs having a mesa configuration, a mesa may be etched above an active layer to define an active region, as disclosed in an article entitled "A New Planar InGaAs-InAlAs Avalanche Photodiode" by Levine, et al. (IEEE Photonics Technology Letters, 2006, Vol. 18, pp. 1898-1900), in U.S. Pat. No. 6,756,613 to Yuan, in U.S. Patent Application No. 2005/0156192 to Ko, et al., and in U.S. Patent Application No. 2004/0251483 to Ko, et al.

The present invention provides a highly reliable photodiode having a mesa configuration, as well as a simple method of fabricating such a photodiode. Advantageously, an active region is defined without modifying an active layer through etching, dopant diffusion, or ion implantation. During fabrication of the photodiode, a grading layer is epitaxially grown on a top surface of an absorption layer, and a blocking layer, for inhibiting current flow, is epitaxially grown on a top surface of the grading layer. The blocking layer is then etched to expose a window region of the top surface of the grading layer. Thus, the etched blocking layer defines an active region of the absorption layer. A window layer is epitaxially regrown on a top surface of the blocking layer and on the window region of the top surface of the grading layer, and is then etched to form a window mesa.

SUMMARY OF THE INVENTION

Accordingly, the present invention relates to a photodiode comprising: a substrate of semiconductor material; a layer stack, disposed on a top surface of the substrate, wherein the layer stack includes a first buffer layer of extrinsic semiconductor material of a first conductivity type, for accommodating lattice mismatch; an absorption layer of intrinsic semiconductor material, for absorbing light to generate current carriers, disposed on a top surface of the layer stack; a grading layer of intrinsic semiconductor material, for facilitating current flow, disposed on a top surface of the absorption layer; a blocking layer of extrinsic semiconductor material of the first conductivity type, for inhibiting current flow, disposed on a top surface of the grading layer with exception of a window region of the top surface of the grading layer; and a window mesa of extrinsic semiconductor material of a second conductivity type, for transmitting light to the absorption layer, disposed on a window region of a top surface of the blocking layer and on the window region of the top surface of the grading layer.

Another aspect of the present invention relates to a method of fabricating a photodiode comprising steps of: a) providing a substrate of semiconductor material; b) epitaxially growing a layer stack on a top surface of the substrate, wherein epitaxially growing the layer stack includes epitaxially growing a buffer layer of extrinsic semiconductor material of a first conductivity type, for accommodating lattice mismatch; c) epitaxially growing an absorption layer of intrinsic semiconductor material, for absorbing light to generate current carriers, on a top surface of the layer stack; d) epitaxially growing a grading layer of intrinsic semiconductor material, for facilitating current flow, on a top surface of the absorption layer; e) epitaxially growing a blocking layer of extrinsic semiconductor material of the first conductivity type, for inhibiting current flow, on a top surface of the grading layer; f) etching the blocking layer to expose a window region of the top surface of the grading layer; g) epitaxially regrowing a window layer of extrinsic semiconductor material of a second conductivity type on a top surface of the blocking layer and on the window region of the top surface of the grading layer; and h) etching the window layer to form a window mesa, for transmitting light to the absorption layer, and to expose the top surface of the blocking layer with exception of a window region of the top surface of the blocking layer.

BRIEF DESCRIPTION OF THE DRAWINGS

The invention will be described in greater detail with reference to the accompanying drawings, which represent exemplary, preferred embodiments thereof, wherein.

DETAILED DESCRIPTION

Figure 1:
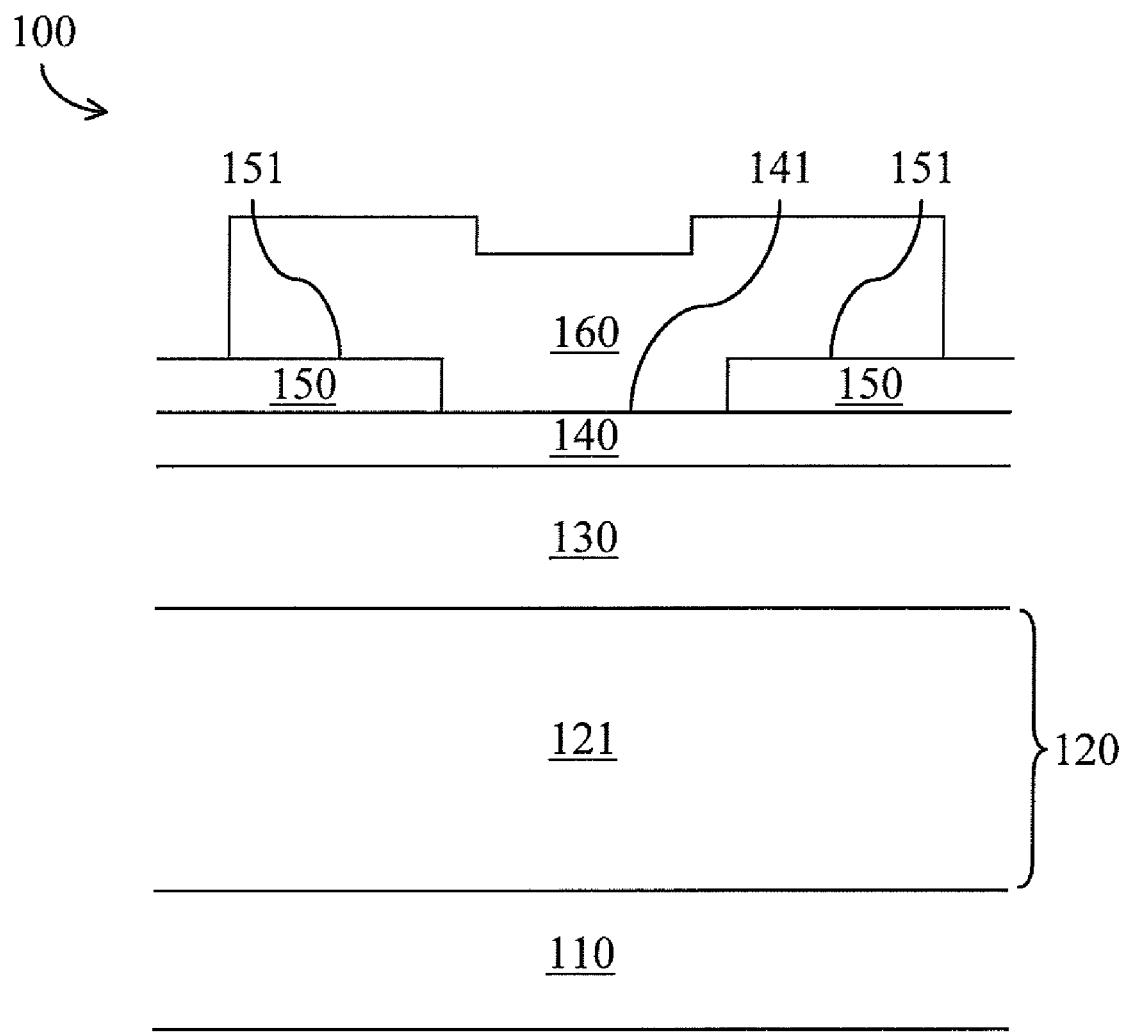
FIG. 1 is a schematic illustration of a cross-section of a PIN-photodiode semiconductor body.

The present invention provides several embodiments of a highly reliable photodiode. With reference to FIG. 1, a PIN-photodiode semiconductor body 100 can be incorporated in various embodiments of a PIN photodiode. The PIN-photodiode semiconductor body 100 includes a substrate 110, a layer stack 120, an absorption layer 130, a grading layer 140, a blocking layer 150, and a window mesa 160.

The layer stack 120 is disposed on a top surface of the substrate 11 0, the absorption layer 130 is disposed on a top surface of the layer stack 120, and the grading layer 140 is disposed on a top surface of the absorption layer 130. The blocking layer 150 is disposed on a top surface of the grading layer 140 with exception of a window region 141 of the top surface of the grading layer 140. Preferably, the blocking layer 150 is ring-shaped, and the window region 141 of the top surface of the grading layer 140 is circular. The window mesa 160 is disposed on a window region 151 of a top surface of the blocking layer 150 and on the window region 141 of the top surface of the grading layer 140. Preferably, the window region 151 of the top surface of the blocking layer 150 is ring-shaped, and the window mesa 160 is cylindrical. Preferably, the top surface of window mesa 160 includes a shallow cylindrical recess. Preferably the top surfaces of the substrate 110, the layer stack 120, the absorption layer 130, the grading layer 140, and the blocking layer 150 are essentially planar and essentially parallel.

The substrate 110 is of semiconductor material and is, preferably, compositionally homogeneous. In some instances, the substrate 110 is of extrinsic semiconductor material of a first conductivity type. In such instances, the substrate 110 is, preferably, of a doped semiconductor compound of n-type or p-type, for example, an n-type or p-type III-V semiconductor compound. An n-type III-V semiconductor compound, typically, includes a donor dopant of Group VI, such as sulfur, selenium, or tellurium, or of Group IV, such as carbon, silicon, or germanium. A p-type III-V semiconductor compound, typically, includes an acceptor dopant of Group II, such as beryllium, zinc, or cadmium, or of Group IV, such as carbon, silicon, or germanium. In such instances, the substrate 110 is, more preferably, of a heavily doped semiconductor compound of $n^+$-type of $p^+$-type, for example, an $n^+$-type or $p^+$-type III-V semiconductor compound. In a preferred embodiment, the substrate 110 is of $n^+$-type InP.

In other instances, the substrate 110 is of semi-insulating semiconductor material. In such instances, the substrate 110 is, preferably, of a semi-insulating semiconductor compound, for example, a semi-insulating III-V semiconductor compound. A semi-insulating III-V semiconductor compound, typically, includes a transition-metal dopant, such as iron or ruthenium. In another preferred embodiment, the substrate 110 is of semi-insulating InP.

The layer stack 120 includes at least a first buffer layer 121. In the illustrated embodiment, the layer stack 120 consists of the first buffer layer 121. The first buffer layer 121, for accommodating lattice mismatch, is of extrinsic semiconductor material of the first conductivity type, which is, preferably, lattice-matched to the semiconductor material of the substrate 110. The first buffer layer 121 is, preferably, compositionally homogeneous. Preferably, the first buffer layer 121 is of a doped semiconductor compound of n-type or p-type, for example, an n-type or p-type III-V semiconductor compound. More preferably, the first buffer layer 121 is of a heavily doped semiconductor compound of $n^+$-type of $p^+$-type, for example, an $n^+$-type or $p^+$-type III-V semiconductor compound. In a preferred embodiment, the first buffer layer 121 is of $n^+$-type InP. In another preferred embodiment, the first buffer layer 121 is of $n^+$-type $In_{1-x}Ga_xAs_yP_{1-y}$, hereafter referred to as InGaAsP, lattice-matched to InP. The compositional range of lattice-matched InGaAsP is $In_{1-x}Ga_xAs_yP_{1-y}$ with $0 \leq x \leq 0.47$ and $0 \leq y \leq 1$.

The absorption layer 130, for absorbing light to generate current carriers, is of intrinsic semiconductor material, which is, preferably, lattice-matched to the semiconductor material of the substrate 110. The intrinsic semiconductor material of the absorption layer 130 is selected to have a narrow band gap, with a band-gap energy corresponding to a wavelength larger than that of light to be detected. The absorption layer 130 is, preferably, compositionally homogeneous. Preferably, the absorption layer 130 is of a semiconductor compound that was not intentionally doped, for example, an intrinsic III-V semiconductor compound. In a preferred embodiment, the absorption layer 130 is of intrinsic $In_{1-x}Ga_xAs$, hereafter referred to as InGaAs, lattice-matched to InP. Lattice-matched InGaAs has a composition of $In_{0.53}Ga_{0.47}As$ and a band-gap energy of about 0.74 eV and, thus, absorbs light having a wavelength of less than about 1.7 μm.

The grading layer 140, for facilitating current flow, is also of intrinsic semiconductor material, which is, preferably, lattice-matched to the semiconductor material of the substrate 110. To facilitate current flow between the absorption layer 130 and the window mesa 160, via the grading layer 140, the intrinsic semiconductor material of the grading layer 140 is selected to have an intermediate band gap, with a band-gap energy larger than that of the intrinsic semiconductor material of the of the absorption layer 130. The grading layer 140 is, preferably, compositionally graded. Preferably, the grading layer 140 is of a semiconductor compound that was not intentionally doped, for example, an intrinsic III-V semiconductor compound. In a preferred embodiment, the grading layer 140 is of intrinsic InGaAsP lattice-matched to InP. A compositional range of lattice-matched InGaAsP having an appropriate band-gap energy range is selected for the grading layer 140.

The blocking layer 150, for inhibiting current flow, is of extrinsic semiconductor material of the first conductivity type, which is, preferably lattice-matched to the semiconductor material of the substrate 110. As the extrinsic semiconductor material of the first buffer layer 121 and the extrinsic semiconductor material of the blocking layer 150 are both of the first conductivity type, current flow between the first buffer layer 121 and the blocking layer 150 is inhibited. However, the blocking layer 150 has an etched opening, through which current can flow, over the window region 141 of the top surface of the grading layer 140. Thus, the blocking layer 150 defines an active region of the absorption layer 130. The blocking layer 150 is, preferably, compositionally homogeneous. Preferably, the blocking layer 150 is of a doped semiconductor compound of n-type or p-type, for example, an n-type or p-type III-V semiconductor compound. In a preferred embodiment, the blocking layer 150 is of n-type InP.

The window mesa 160, for transmitting light to the absorption layer 130, is of extrinsic semiconductor material of a second conductivity type, which is, preferably lattice-matched to the semiconductor material of the substrate 110. To facilitate current flow between the absorption layer 130 and the window mesa 160, via the grading layer 140, the extrinsic semiconductor material of the window mesa 160 is selected to have wide band gap, with a band-gap energy larger than that of the intrinsic semiconductor material of the grading layer 140. Furthermore, the extrinsic semiconductor material of the window mesa 160 is selected to have a band-gap energy corresponding to a wavelength smaller than that of light to be detected. The window mesa 160 is, preferably, compositionally homogeneous. Preferably, the window mesa 160 is of a doped semiconductor compound of p-type or n-type, for example, a p-type or n-type III-V semiconductor compound. More preferably, the first buffer layer 121 is of a heavily doped semiconductor compound of $p^+$-type or of $n^+$-type, for example, an $p^+$-type or $n^+$-type III-V semiconductor compound. In a preferred embodiment, the window mesa 160 is of $p^+$-type InP, which has a band-gap energy of about 1.35 eV and, thus, transmits light having a wavelength greater than about 0.92 μm. In another preferred embodiment, the window mesa 160 is of $p^+$-type InGaAsP lattice-matched to InP. A composition of lattice-matched InGaAsP having an appropriate band-gap energy is selected for the window mesa 160.

Figure 2:
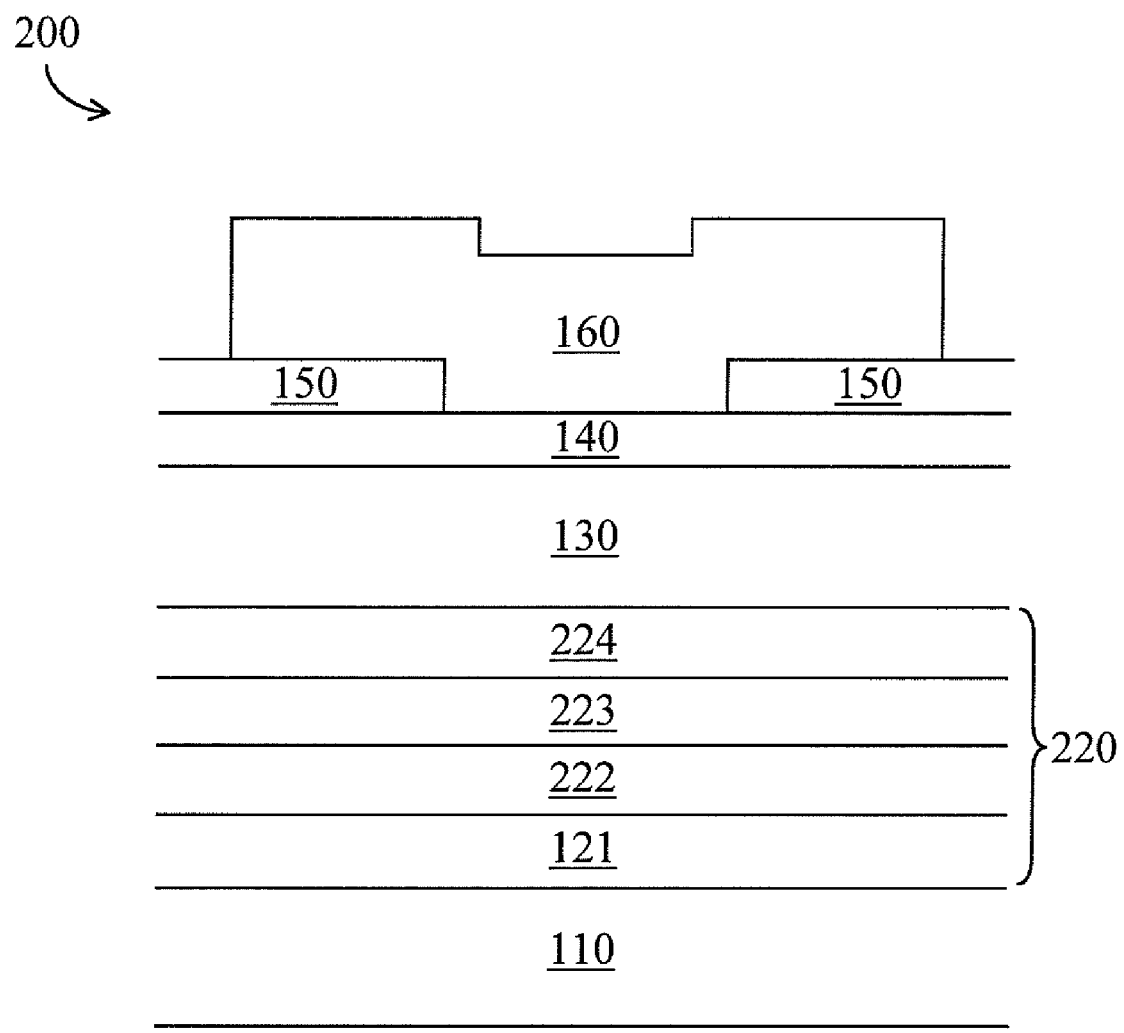
FIG. 2 is a schematic illustration of a cross-section of an APD semiconductor body.

With reference to FIG. 2, an APD semiconductor body 200 can be incorporated in various embodiments of an APD. The APD semiconductor body 200 includes the substrate 110, the absorption layer 130, the grading layer 140, the blocking layer 150, and the window mesa 160 of the PIN-photodiode semiconductor body 100. In addition, the APD semiconductor body 200 comprises a layer stack 220 including a second buffer layer 222, a multiplication layer 223, and a field-control layer 224, in addition to the first buffer layer 121 of the PIN-photodiode semiconductor body 100. The second buffer layer 222 is disposed on a top surface of the first buffer layer 121, the multiplication layer 223 is disposed on a top surface of the second buffer layer 222, and the field-control layer 224 is disposed on a top surface of the multiplication layer 223.

The second buffer layer 222, for accommodating lattice mismatch, is of extrinsic semiconductor material of the first conductivity type, which is, preferably, lattice-matched to the semiconductor material of the substrate 110. The second buffer layer 222 is, preferably, compositionally homogeneous. Preferably, the second buffer layer 222 is of a doped semiconductor compound of n-type or p-type, for example, an n-type or p-type III-V semiconductor compound. More preferably, the second buffer layer 222 is of a heavily doped semiconductor compound of $n^+$-type of $p^+$-type, for example, an $n^+$-type or $p^+$-type III-V semiconductor compound. In a preferred embodiment, the second buffer layer 222 is of $n^+$-type $In_{1-x}Al_xAs$, hereafter referred to as InAlAs, lattice-matched to InP. The composition of lattice-matched InAlAs is $In_{0.52}Al_{0.48}As$.

The multiplication layer 223, for multiplying current carriers in an avalanche multiplication process, is of semiconductor material, which is, preferably, lattice-matched to the semiconductor material of the substrate 110. The multiplication layer 223 is, preferably, compositionally homogeneous. In some instances, the multiplication layer 223 is of intrinsic semiconductor material. In such instances, the multiplication layer 223 is, preferably, of a semiconductor compound that was not intentionally doped, for example, an intrinsic III-V semiconductor compound. In a preferred embodiment, the multiplication layer 223 is of intrinsic InAlAs lattice-matched to InP.

In other instances, the multiplication layer 223 is of extrinsic semiconductor material of the second conductivity type. In such instances, the multiplication layer 223 is, preferably, of a doped semiconductor compound of p-type or n-type, for example, a p-type or n-type III-V semiconductor compound. More preferably, the multiplication layer 223 is of a lightly doped semiconductor compound of $p^-$-type of $n^-$-type, for example, an $p^-$-type or $n^-$-type III-V semiconductor compound. In another preferred embodiment, the multiplication layer 223 is of $p^-$-type InAlAs lattice-matched to InP.

The field-control layer 224, for controlling an electric field in the multiplication layer 223, is of extrinsic semiconductor material of the second conductivity type, which is, preferably, lattice-matched to the semiconductor material of the substrate 110. The field-control layer 224 is, preferably, compositionally homogeneous. Preferably, the field-control layer 224 is of a doped semiconductor compound of p-type or n-type, for example, a p-type or n-type III-V semiconductor compound. More preferably, the field-control layer 224 is of a heavily doped semiconductor compound of $p^+$-type of $n^+$-type, for example, a $p^+$-type or $n^+$-type III-V semiconductor compound. In a preferred embodiment, the field-control layer 224 is of $p^+$-type InAlAs lattice-matched to InP.

Figure 3:
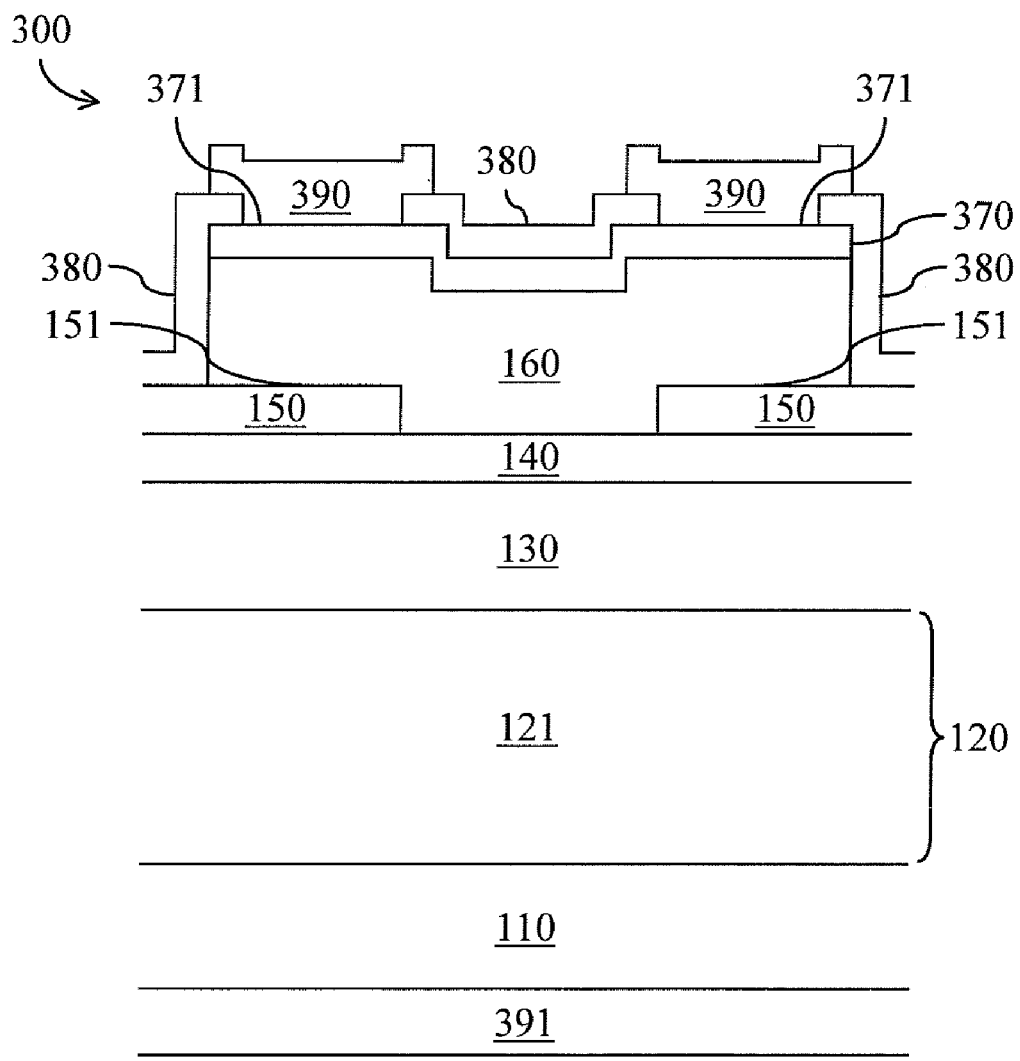
FIG. 3 is a schematic illustration of a cross-section of a first embodiment of a PIN photodiode.

With reference to FIG. 3, a first embodiment of a PIN photodiode 300 includes the PIN-photodiode semiconductor body 100, in which the substrate 110 is of extrinsic semiconductor material of the first conductivity type. In addition, the PIN photodiode 300 includes a capping layer 370, an antireflective layer 380, a top contact 390, and a bottom contact 391. The capping layer 370 is disposed on a top surface of the window mesa 160. The antireflective layer 380 is disposed on a top surface of the capping layer 370 with exception of a contact region 371 of the top surface of the capping layer 370, on a side surface of the window mesa 160, and on the top surface of the blocking layer 150 with exception of the window region 151 of the top surface of the blocking layer 150. The top contact 390 is disposed on the contact region 371 of the top surface of the capping layer 370, and the bottom contact 391 is disposed on a bottom surface of the substrate 110. Preferably, the contact region 371 of the top surface of the capping layer 370 is ring-shaped, the top contact 390 is annular, and the bottom contact 391 is circular.

The capping layer 370, for ohmic contacting, is of extrinsic semiconductor material of the second conductivity type, which is, preferably, lattice-matched to the semiconductor material of the substrate 110. The capping layer 370 is, preferably, compositionally homogeneous. Preferably, the capping layer 370 is of a doped semiconductor compound of p-type or n-type, for example, a p-type or n-type III-V semiconductor compound. More preferably, the capping layer 370 is of a heavily doped semiconductor compound of $p^+$-type of $n^+$-type, for example, a $p^+$-type or $n^+$-type III-V semiconductor compound. In a preferred embodiment, the capping layer 370 is of $p^+$-type InGaAs lattice-matched to InP.

The antireflective layer 380, for inhibiting reflection of light, is of insulator material, such as $SiN_x$, $SiO_xN_y$, or $SiO_2$. In a preferred embodiment, the antireflective layer 380 is of $SiN_x$.

The top contact 390 and the bottom contact 391 are of metallic material. Preferably, the top contact 390 includes a plurality of layers of metallic material. In a preferred embodiment, the top contact 390 includes a layer of titanium, a layer of platinum, and a layer of gold. In a preferred embodiment, the bottom contact 391 is of a gold-germanium alloy.

Figure 4:
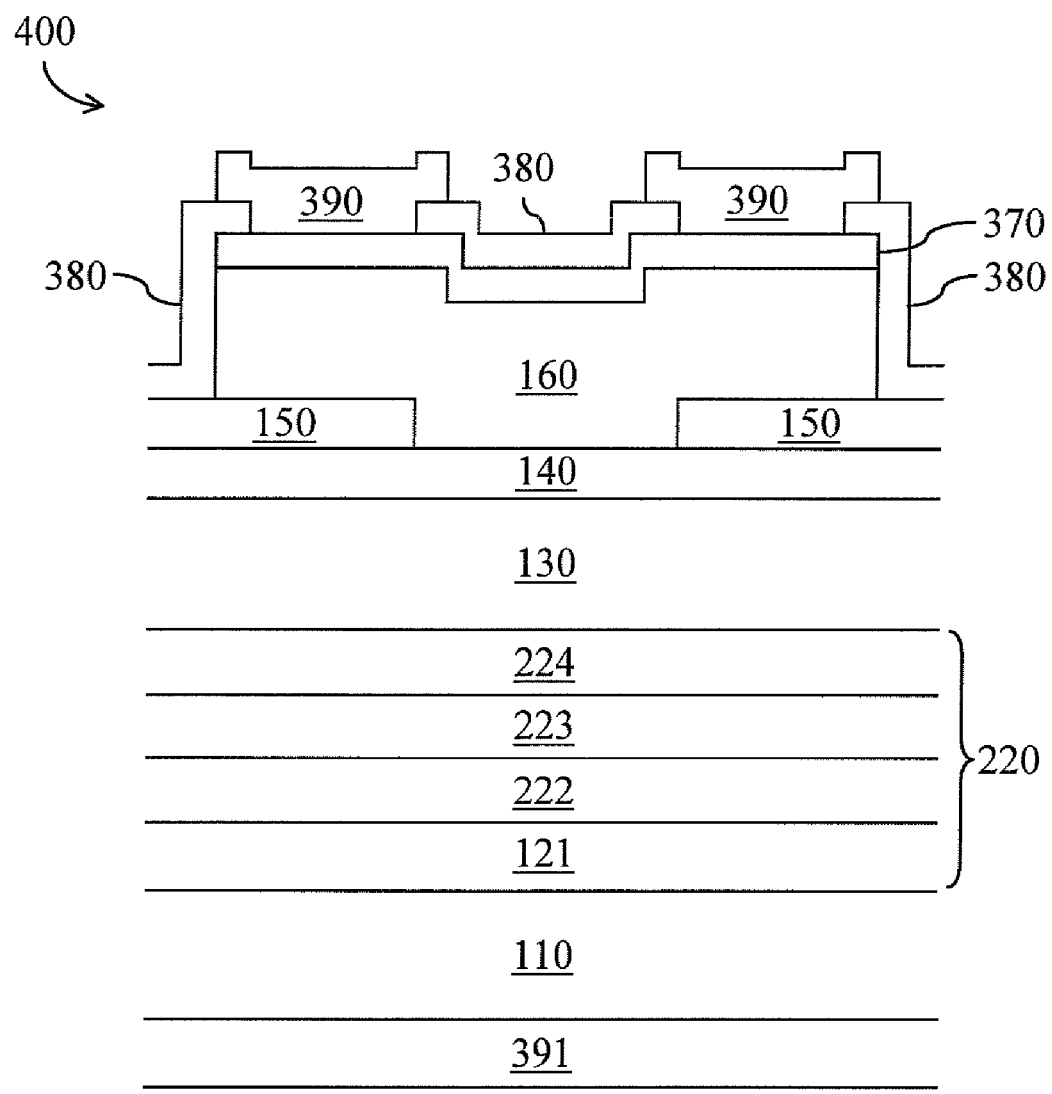
FIG. 4 is a schematic illustration of a cross-section of a first embodiment of an APD.

With reference to FIG. 4, a first embodiment of an APD 400 includes the APD semiconductor body 200, in which the substrate 110 is of extrinsic semiconductor material of the first conductivity type. In addition, the APD 400 includes the capping layer 370, the antireflective layer 380, the top contact 390, and the bottom contact 391 of the PIN photodiode 300.

Figure 5:
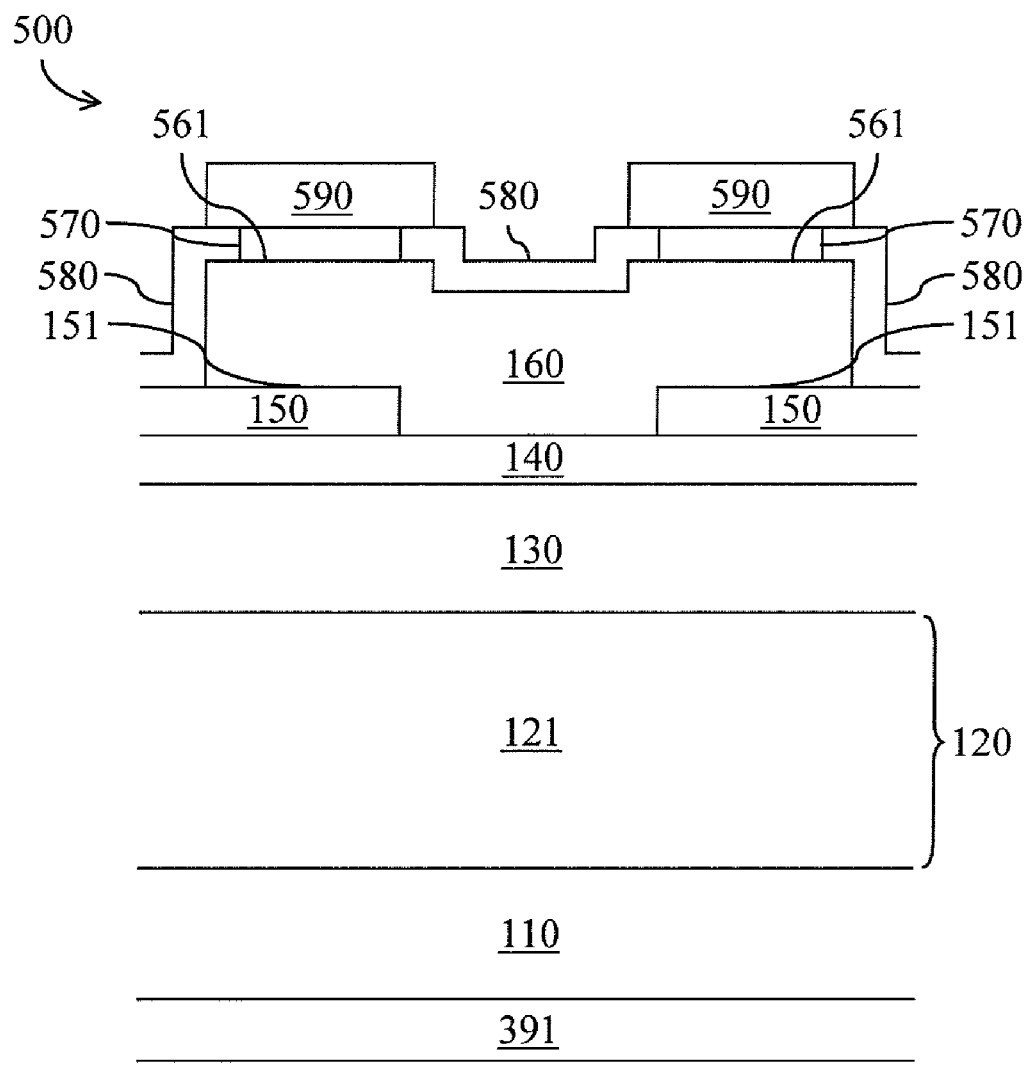
FIG. 5 is a schematic illustration of a cross-section of a second embodiment of a PIN photodiode.

With reference to FIG. 5, a second embodiment of a PIN photodiode 500 includes the PIN-photodiode semiconductor body 100, in which the substrate 110 is of extrinsic semiconductor material of the first conductivity type. The PIN photodiode 500 also includes the bottom contact 391 of the PIN photodiode 300. In addition, the PIN photodiode 500 includes a capping ring 570, an antireflective layer 580, and a top contact 590. The capping ring 570, which is essentially equivalent in composition to the capping layer 370 of the PIN photodiode 300, is disposed on a ring-shaped capping region 561 of the top surface of the window mesa 160. The antireflective layer 580, which is essentially equivalent in composition to the antireflective layer 380 of the PIN photodiode 300, is disposed on the top surface of the window mesa 160 with exception of the capping region 561 of the top surface of the window mesa 160, on the side surface of the window mesa 160, and on the top surface of the blocking layer 150 with exception of the window region 151 of the top surface of the blocking layer 150. The top contact 590, which is essentially equivalent in composition to the top contact 390 of the PIN photodiode 300, is disposed on a top surface of the capping ring 570.

Figure 6:
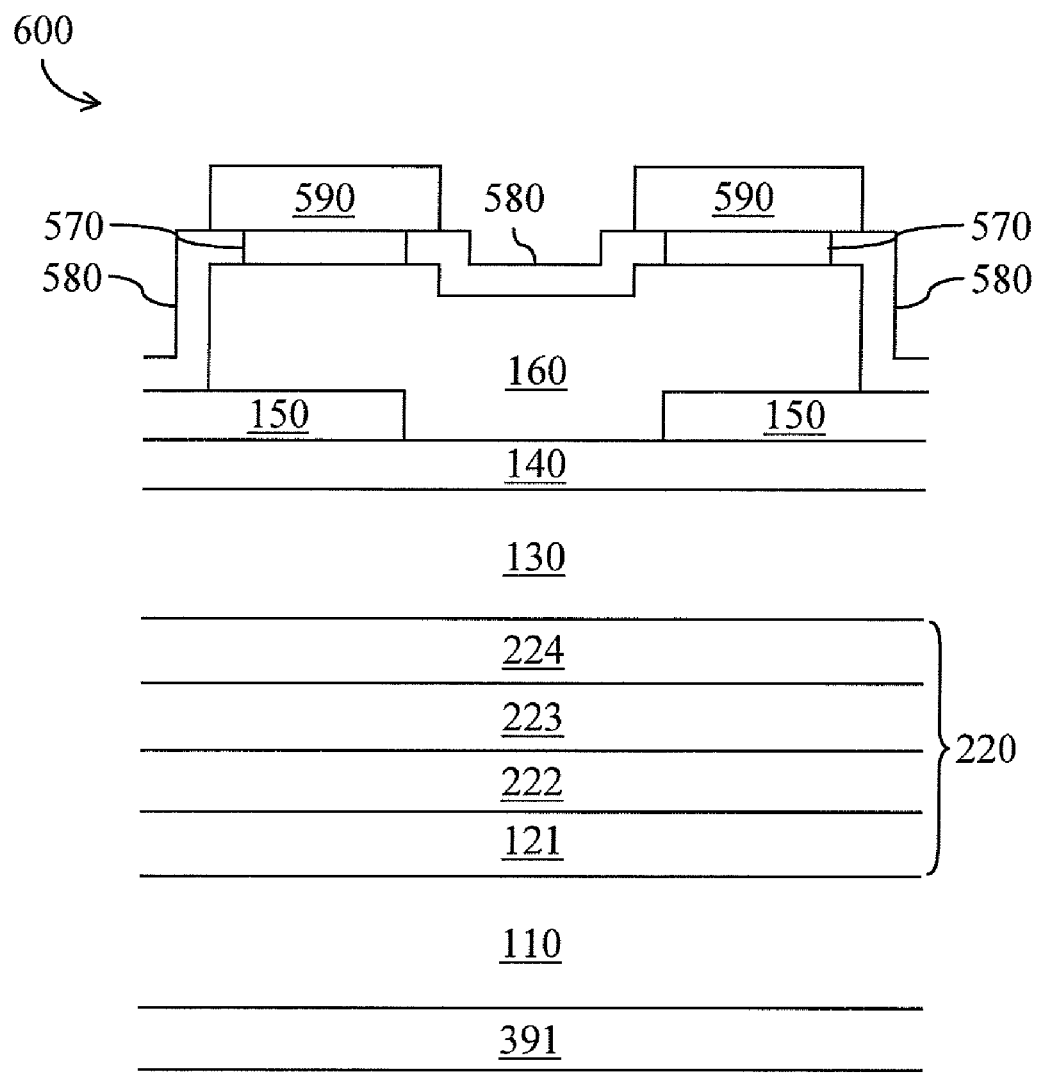
FIG. 6 is a schematic illustration of a cross-section of a second embodiment of an APD.

With reference to FIG. 6, a second embodiment of an APD 600 includes the APD semiconductor body 200, in which the substrate 110 is of extrinsic semiconductor material of the first conductivity type. The APD 600 also includes the bottom contact 391 of the PIN photodiode 300, as well as the capping ring 570, the antireflective layer 580, and the top contact 590 of the PIN photodiode 500.

Figure 7:
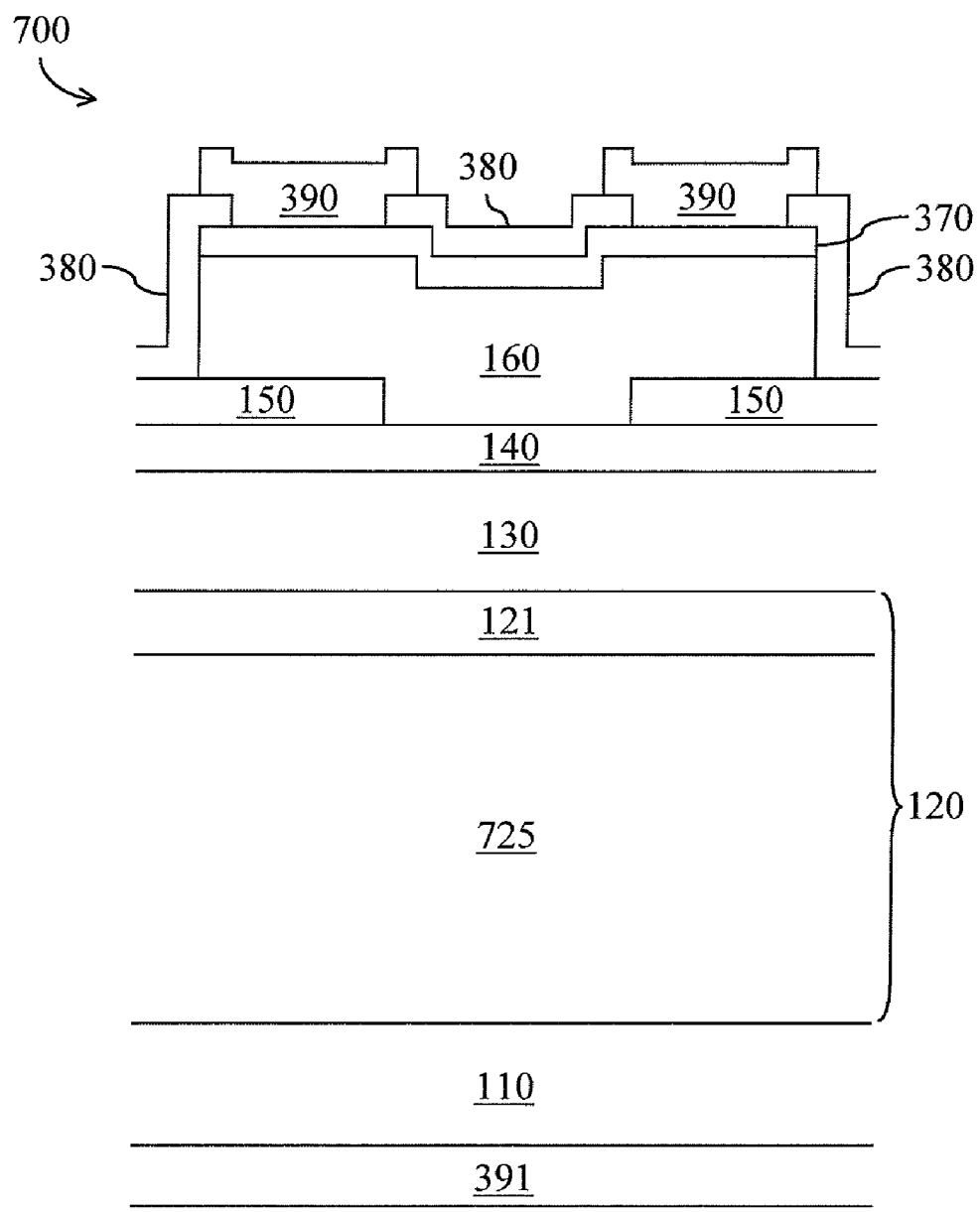
FIG. 7 is a schematic illustration of a cross-section of a third embodiment of a PIN photodiode.

With reference to FIG. 7, a third embodiment of a PIN photodiode 700 is optimized for top illumination. The PIN photodiode 700 includes the PIN-photodiode semiconductor body 100, in which the substrate 110 is of extrinsic semiconductor material of the first conductivity type. In addition, the PIN photodiode 700 includes a distributed Bragg reflector (DBR) layer 725 as part of the layer stack 120. The first buffer layer 121 is disposed on a top surface of the DBR layer 725. The PIN photodiode 700 also includes the capping layer 370, the antireflective layer 380, the top contact 390, and the bottom contact 391 of the PIN photodiode 300.

The DBR layer 725, for reflecting light toward the absorption layer 130, is of extrinsic semiconductor material of the first conductivity type, which is, preferably, lattice-matched to the semiconductor material of the substrate 110. Preferably, the DBR layer 725 includes a plurality of alternating layers of two compositions. Preferably, the DBR layer 725 is of two doped semiconductor compounds of n-type or p-type, for example, n-type or p-type III-V semiconductor compounds. In a preferred embodiment, the DBR layer 725 includes a plurality of alternating layers of n-type InAlAs lattice-matched to InP and of n-type $In_{1-x-y}Ga_xAl_yAs$, hereafter referred to as InGaAlAs, lattice-matched to InP. The compositional range of lattice-matched InGaAlAs is $In_{1-x-y}Ga_xAl_yAs$ with $0 \leq x \leq 0.47$ and $0 \leq y \leq 0.48$. A composition of lattice-matched InGaAlAs having an appropriate refractive index for providing Bragg reflection is selected for the DBR layer 725.

Figure 8:
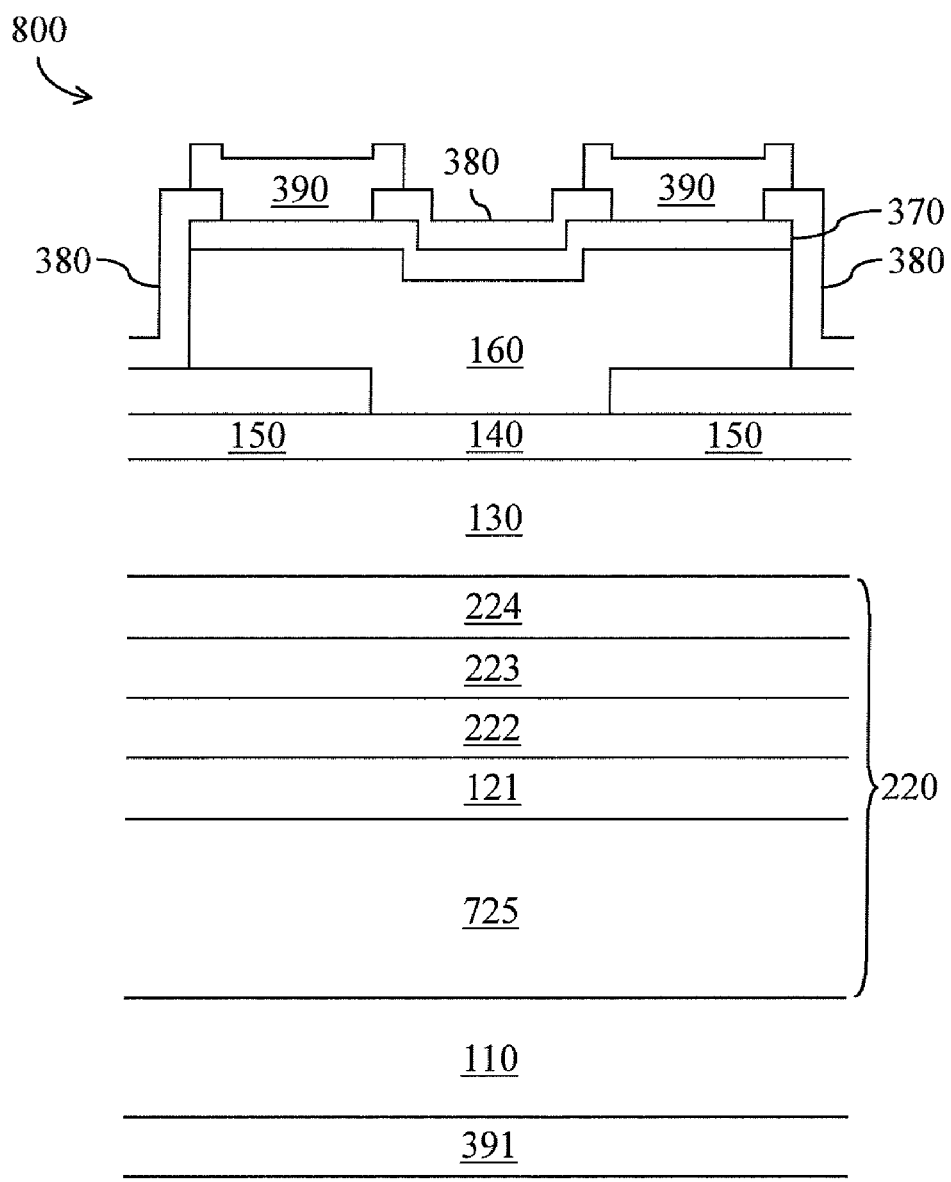
FIG. 8 is a schematic illustration of a cross-section of a third embodiment of an APD.

With reference to FIG. 8, a third embodiment of an APD 800 is optimized for top illumination. The APD 800 includes the APD semiconductor body 200, in which the substrate 110 is of extrinsic semiconductor material of the first conductivity type. In addition, the APD 800 includes the distributed Bragg reflector (DBR) layer 725 of the PIN photodiode 700 as part of the layer stack 220. The first buffer layer 121 is disposed on the top surface of the DBR layer 725. The APD 800 also includes the capping layer 370, the antireflective layer 380, the top contact 390, and the bottom contact 391 of the PIN photodiode 300.

Figure 9:
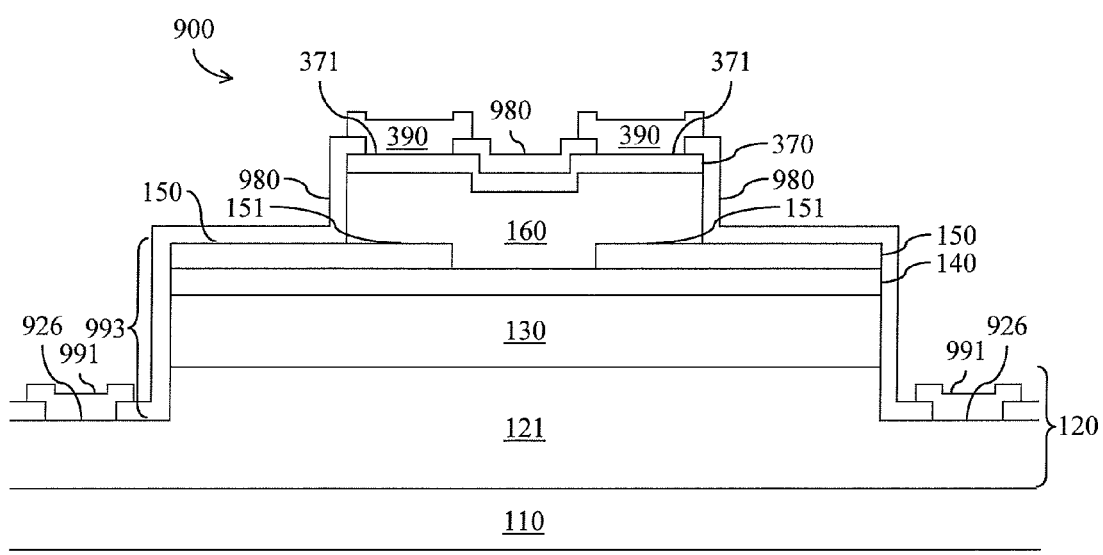
FIG. 9 is a schematic illustration of a cross-section of a fourth embodiment of a PIN photodiode.

With reference to FIG. 9, a fourth embodiment of a PIN photodiode 900 is optimized for top contacting. The PIN photodiode 900 includes the PIN-photodiode semiconductor body 100, in which the substrate 110 is of semi-insulating semiconductor material. In addition, the PIN photodiode 900 comprises a lower mesa 993, which includes the blocking layer 150, the grading layer 140, the absorption layer 130, and a top part of the layer stack 120. Preferably, the lower mesa 993 is cylindrical and has a diameter that is larger than that of the window mesa 160.

The PIN photodiode 900 also includes the capping layer 370 and the top contact 390 of the PIN photodiode 300, as well as an antireflective layer 980 and a bottom contact 991. The antireflective layer 980, which is essentially equivalent in composition to the antireflective layer 380 of the PIN photodiode 300, is disposed on the top surface of the capping layer 370 with exception of the contact region 371 of the top surface of the capping layer 370, on the side surface of the window mesa 160, and on the top surface of the blocking layer 150 with exception of the window region 151 of the top surface of the blocking layer 150, on a side surface of the lower mesa 993, and on a top surface of a bottom part of the layer stack 120 with exception of a contact region 926 of the top surface of the bottom part of the layer stack 120. The bottom contact 991, which is essentially equivalent in composition to the bottom contact 391 of the PIN photodiode 300, is disposed on the contact region 926 of the top surface of the bottom part of the layer stack 120. Preferably, the contact region 926 of the top surface of the bottom part of the layer stack 120 is ring-shaped, and the bottom contact 991 is annular.

Figure 10:
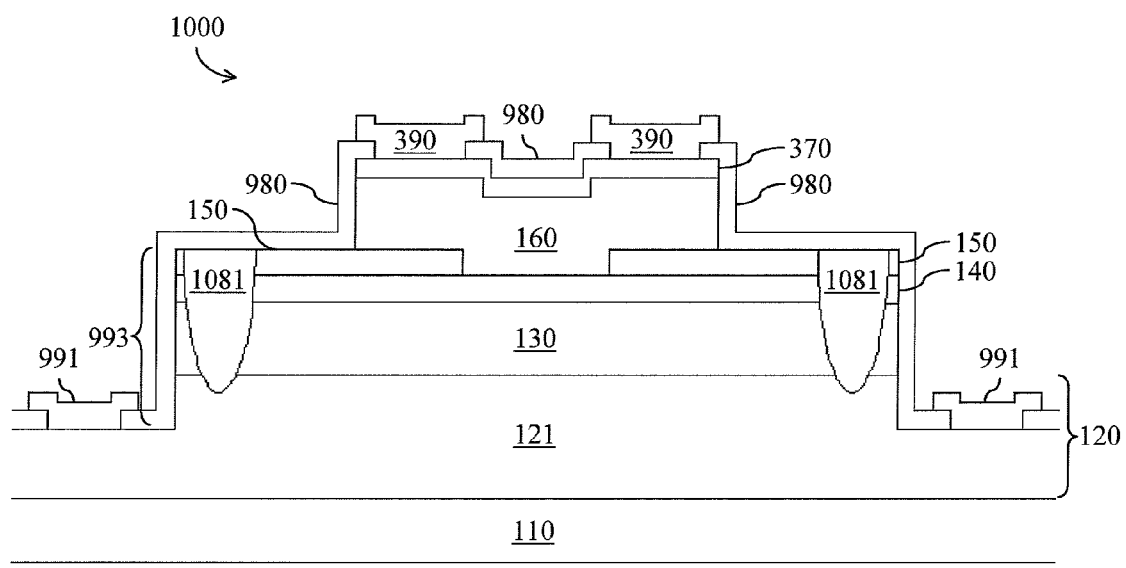
FIG. 10 is a schematic illustration of a cross-section of a fifth embodiment of a PIN photodiode.

With reference to FIG. 10, a fifth embodiment of a PIN photodiode 1000 is optimized for top contacting. The PIN photodiode 1000 includes the PIN-photodiode semiconductor body 100, in which the substrate 110 is of semi-insulating semiconductor material. The PIN photodiode 1000 also includes the capping layer 370 and the top contact 390 of the PIN photodiode 300, as well as the lower mesa 993, the antireflective layer 980, and the bottom contact 991 of the PIN photodiode 900. In addition, the PIN photodiode 1000 includes an implant region 1081, disposed at a periphery of the lower mesa 993 in the blocking layer 150, the grading layer 140, and the absorption layer 130.

The implant region 1081, for inhibiting current flow, is implanted with ions, such as $H^+$ or $B^+$, such that the semiconductor materials of the blocking layer 150, the grading layer 140, and the absorption layer 130 are insulating in the implant region 1081.

Figure 11:
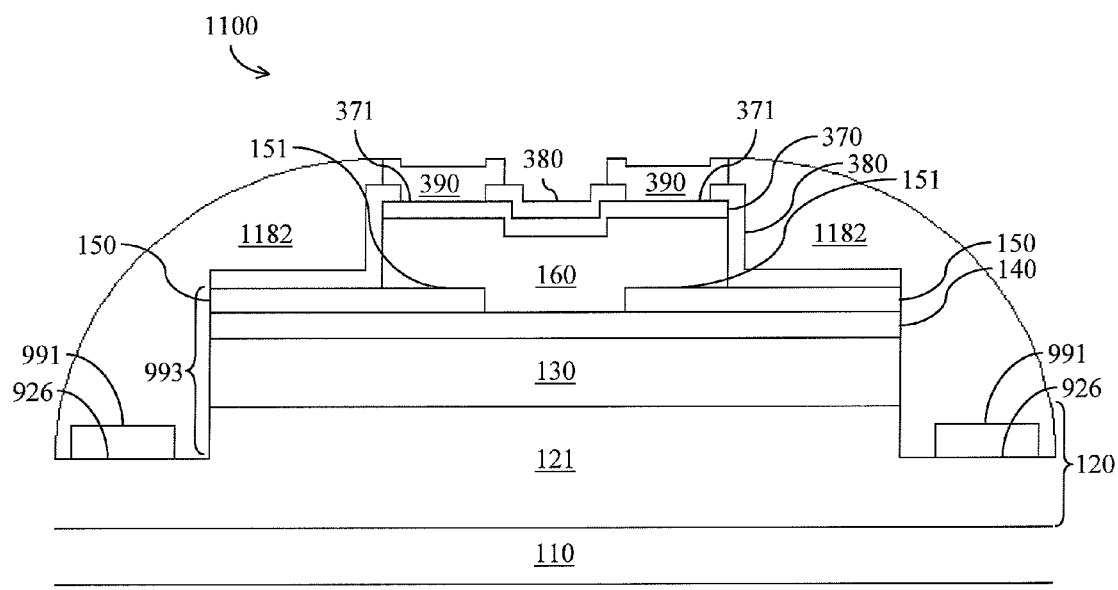
FIG. 11 is a schematic illustration of a cross-section of a sixth embodiment of a PIN photodiode.

With reference to FIG. 11, a sixth embodiment of a PIN photodiode 1100 is optimized for top contacting. The PIN photodiode 1100 includes the PIN-photodiode semiconductor body 100, in which the substrate 110 is of semi-insulating semiconductor material. The PIN photodiode 1100 also includes the capping layer 370, the antireflective layer 380, and the top contact 390 of the PIN photodiode 300, as well as the lower mesa 993 and the bottom contact 991 of the PIN photodiode 900. In addition, the PIN photodiode 1100 includes a passivation layer 1182 of insulator material. The passivation layer 1182 is disposed on the side surface of the lower mesa 993, and on the top surface of the bottom part of the layer stack 120 with exception of the contact region 926 of the top surface of the bottom part of the layer stack 120.

In some instances, the antireflective layer 380 may be omitted, and the passivation layer 1182 may be disposed on the top surface of the contact layer 370 with exception of the contact region 371 of the top surface of the capping layer 370, on the side surface of the window mesa 160, and on the top surface of the blocking layer 150 with exception of the window region 151 of the top surface of the blocking layer 150, as well as on the side surface of the lower mesa 993, and on the top surface of the bottom part of the layer stack 120 with exception of the contact region 926 of the top surface of the bottom part of the layer stack 120.

The passivation layer 1182, for passivating exposed surfaces, is of insulator material. In a preferred embodiment, the passivation layer 1182 is of benzocyclobutene (BCB). In another preferred embodiment, the passivation layer 1182 is of a polyimide.

Figure 12:
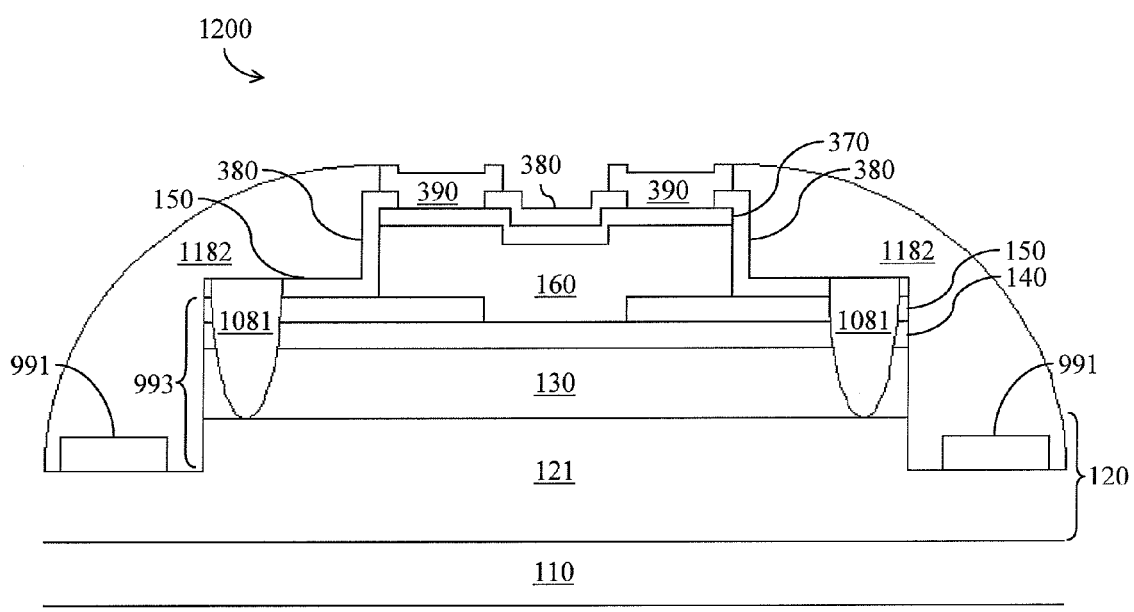
FIG. 12 is a schematic illustration of a cross-section of a seventh embodiment of a PIN photodiode.

With reference to FIG. 12, a seventh embodiment of a PIN photodiode 1200 is optimized for top contacting. The PIN photodiode 1200 includes the PIN-photodiode semiconductor body 100, in which the substrate 110 is of semi-insulating semiconductor material. In addition, the PIN photodiode 1200 includes the capping layer 370, the antireflective layer 380, and the top contact 390 of the PIN photodiode 300, the lower mesa 993 and the bottom contact 991 of the PIN photodiode 900, the implant region 1081 of the PIN photodiode 1000, and the passivation layer 1182 of the PIN photodiode 1100. In some instances, the antireflective layer 380 may be omitted, as described heretofore.

Figure 13:
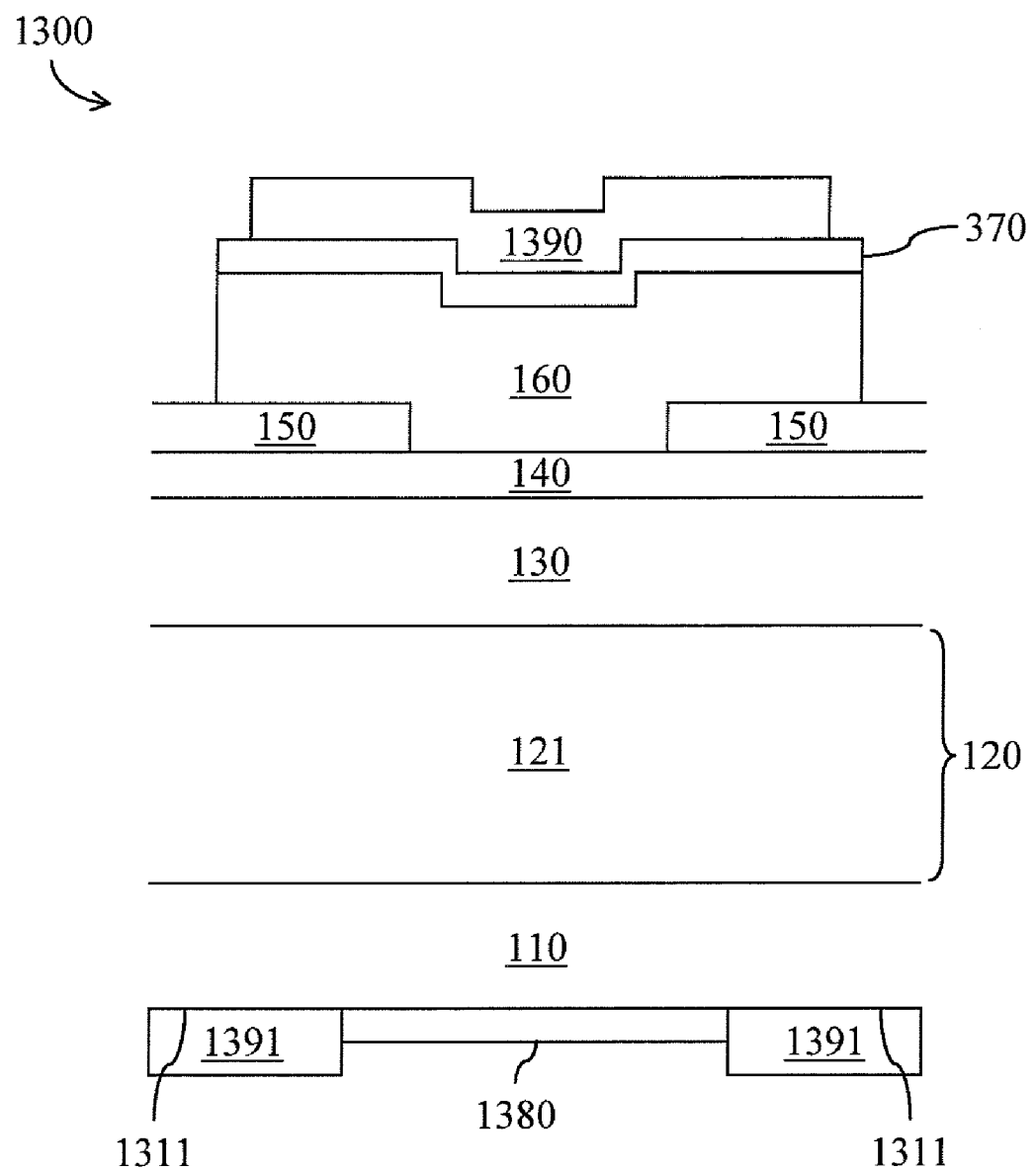
FIG. 13 is a schematic illustration of a cross-section of an eighth embodiment of a PIN photodiode.

With reference to FIG. 13, an eighth embodiment of a PIN photodiode 1300 is optimized for bottom illumination. The PIN photodiode 1300 includes the PIN-photodiode semiconductor body 100, in which the substrate 110 is of extrinsic semiconductor material of the first conductivity type. The PIN photodiode 1300 also includes the capping layer 370 of the PIN photodiode 300.

In addition, the PIN photodiode 1300 includes an antireflective layer 1380, a reflective top contact 1390, and a bottom contact 1391. The antireflective layer 1380, which is essentially equivalent in composition to the antireflective layer 380 of the PIN photodiode 300, is disposed on the bottom surface of the substrate 110 with exception of a contact region 1311 of the bottom surface of the substrate 110. The reflective top contact 1390 is disposed on the top surface of the capping layer 370. Preferably, the reflective top contact 1390 is circular. The bottom contact 1391, which is essentially equivalent in composition to the bottom contact 391 of the PIN photodiode 300, is disposed on the contact region 1311 of the bottom surface of the substrate 110. Preferably, the contact region 1311 of the bottom surface of the substrate 110 is ring-shaped, and the bottom contact 1391 is annular.

The reflective top contact 1390, for reflecting light toward the absorption layer 130, is of metallic material. Preferably, the reflective top contact 1390 includes a plurality of layers of metallic material. In a preferred embodiment, the top contact 390 includes a layer of titanium, a layer of platinum, and a layer of gold.

Figure 14:
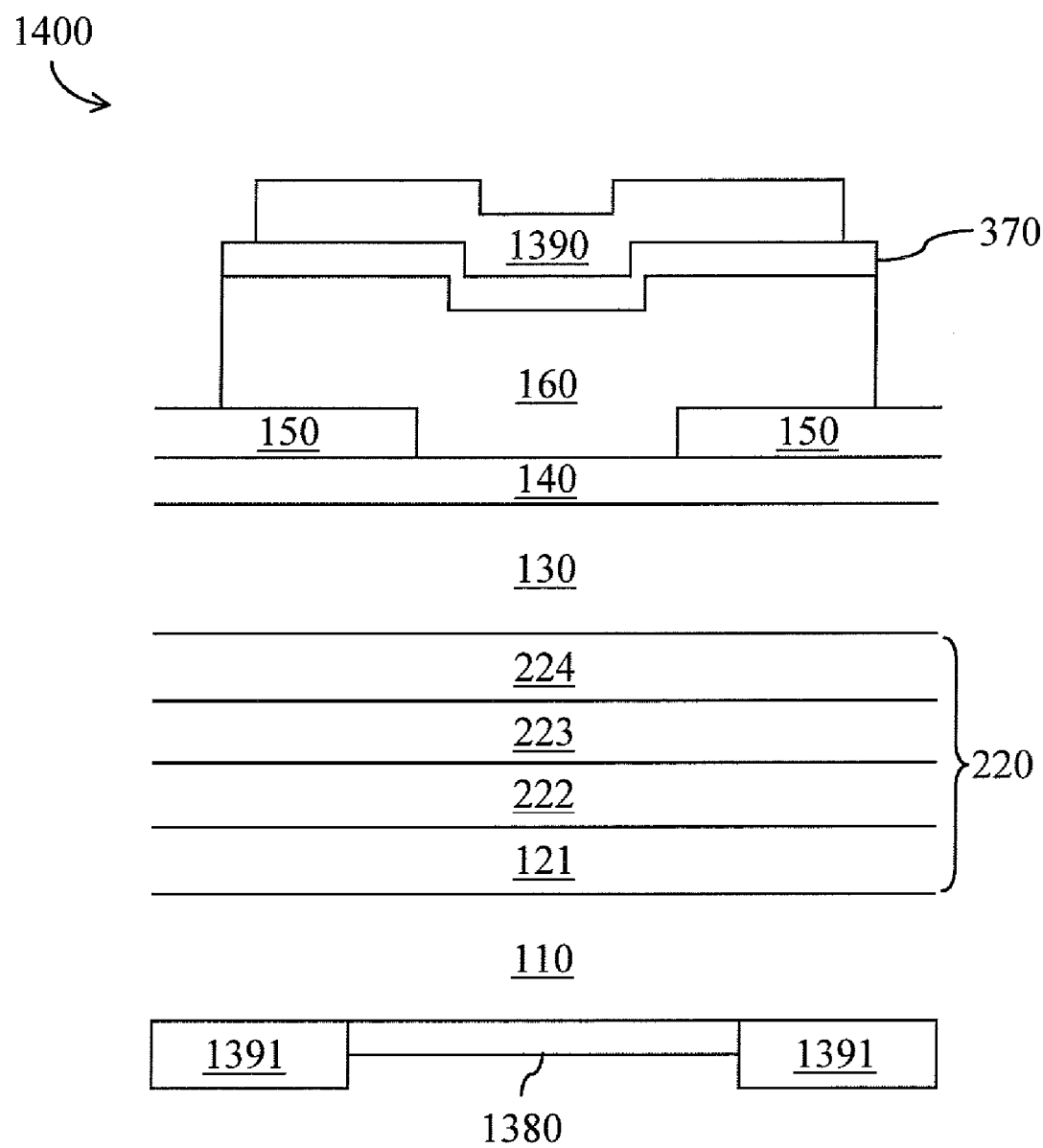
FIG. 14 is a schematic illustration of a cross-section of a fourth embodiment of an APD.

With reference to FIG. 14, a fourth embodiment of an APD 1400 is optimized for bottom illumination. The APD 1400 includes the APD semiconductor body 200, in which the substrate 110 is of extrinsic semiconductor material of the first conductivity type. The APD 1400 also includes the capping layer 370 of the PIN photodiode 300, as well as the antireflective layer 1380, the reflective top contact 1390, and the bottom contact 1391 of the PIN photodiode 1300.

Figure 15:
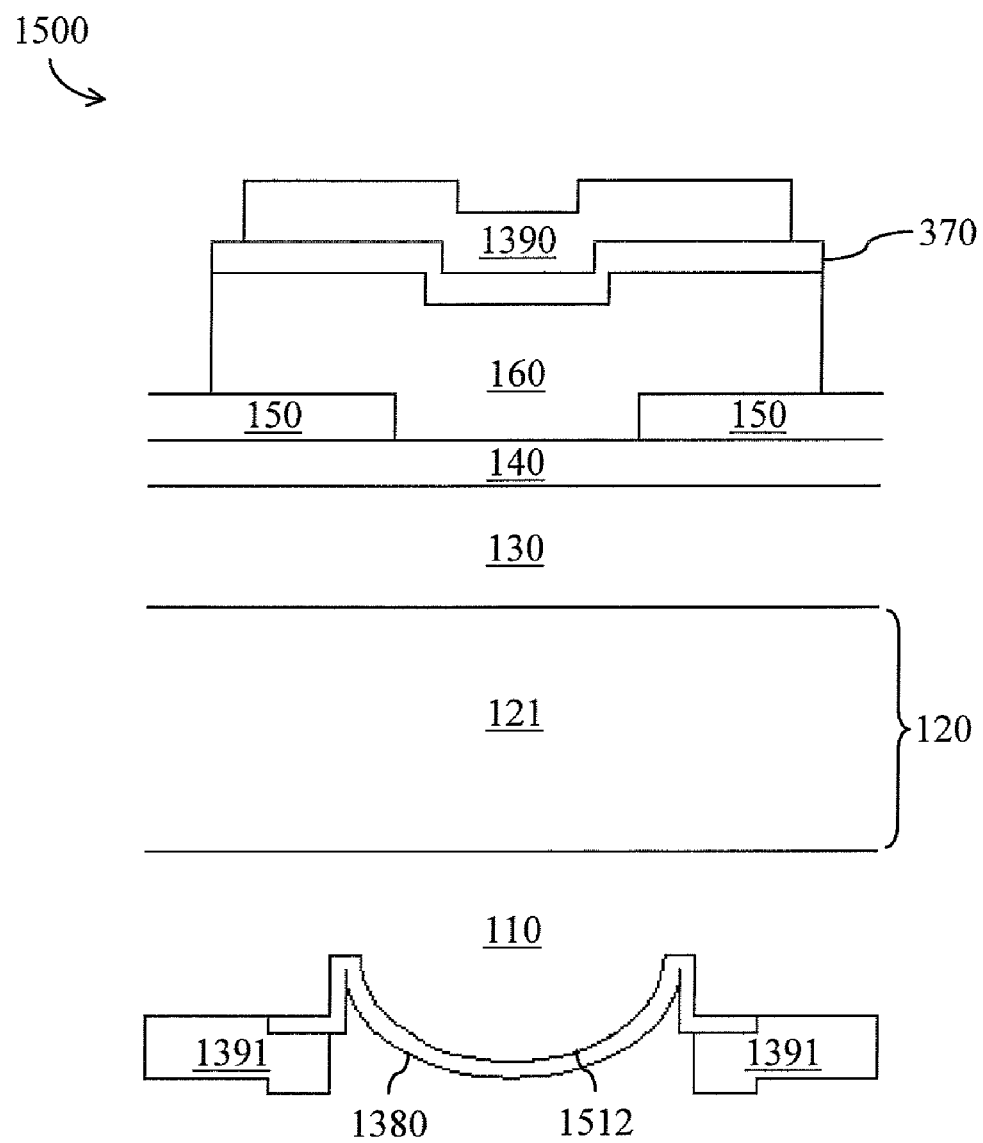
FIG. 15 is a schematic illustration of a cross-section of a ninth embodiment of a PIN photodiode.

With reference to FIG. 15, a ninth embodiment of a PIN photodiode 1500 is optimized for bottom illumination. The PIN photodiode 1500 includes the PIN-photodiode semiconductor body 100, in which the substrate 110 is of extrinsic semiconductor material of the first conductivity type. The PIN photodiode 1500 also includes the capping layer 370 of the PIN photodiode 300, as well as the antireflective layer 1380, the reflective top contact 1390, and the bottom contact 1391 of the PIN photodiode 1300. In addition, the substrate 110 of the PIN photodiode 1500 includes a microlens 1512, for focusing light toward the absorption layer 130, disposed on the bottom surface of the substrate 110.

Figure 16:
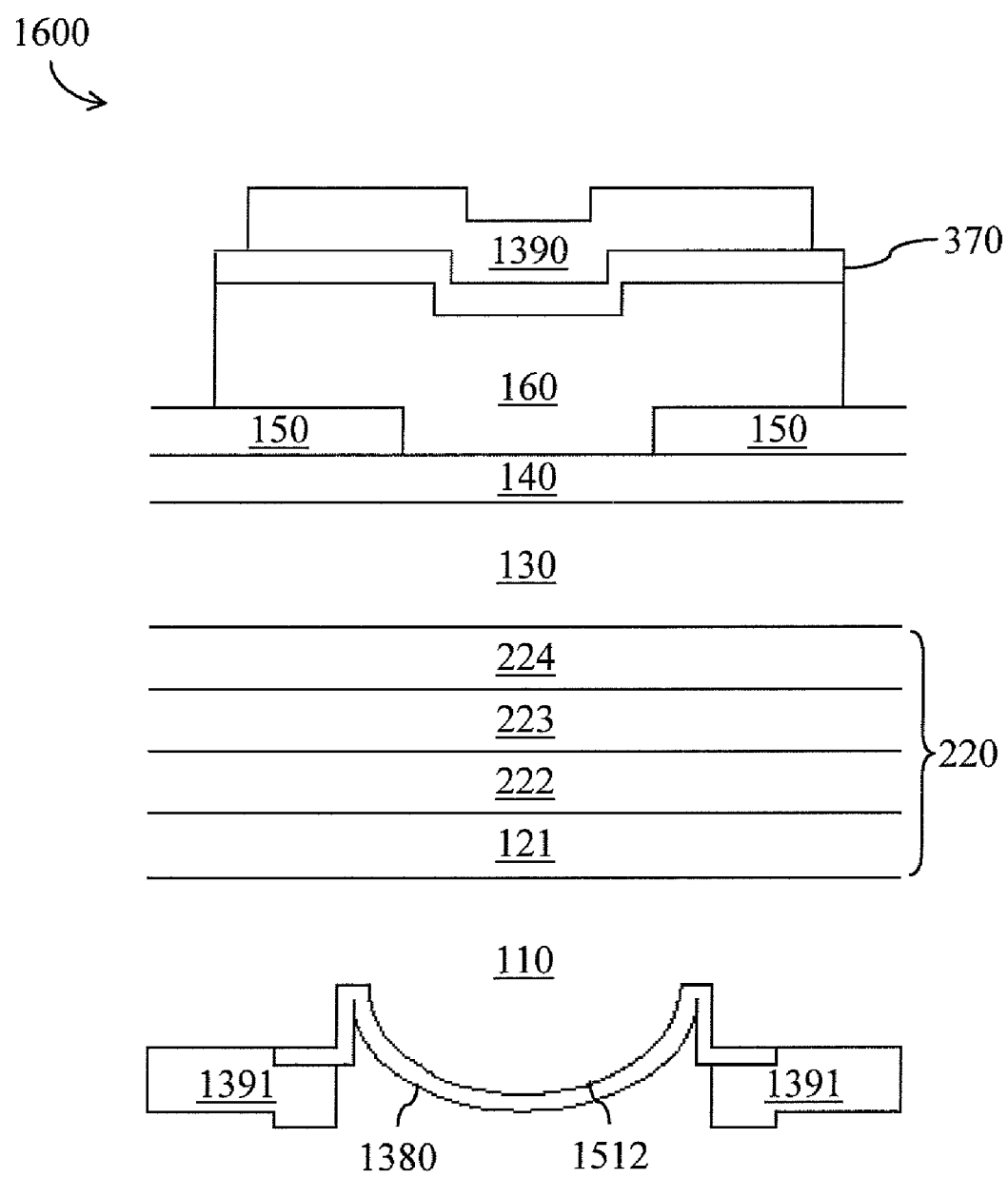
FIG. 16 is a schematic illustration of a cross-section of a fifth embodiment of an APD.

With reference to FIG. 16, a fifth embodiment of an APD 1600 is optimized for bottom illumination. The APD 1600 includes the APD semiconductor body 200, in which the substrate 110 is of extrinsic semiconductor material of the first conductivity type. The APD 1600 also includes the capping layer 370 of the PIN photodiode 300, as well as the antireflective layer 1380, the reflective top contact 1390, and the bottom contact 1391 of the PIN photodiode 1300. In addition, the substrate 110 of the APD 1600 includes the microlens 1512 of the PIN photodiode 1500.

The present invention also provides several embodiments of a method of fabricating a highly reliable photodiode. With reference to FIG. 1, a method of fabricating the PIN-photodiode semiconductor body 100 can be incorporated in various embodiments of a method of fabricating a PIN photodiode. To fabricate the PIN-photodiode semiconductor body 100, the substrate 110 is provided in a first step. The layer stack 120 is then epitaxially grown on the top surface of the substrate 110, by epitaxially growing at least the first buffer layer 121. The absorption layer 130 is epitaxially grown on the top surface of the layer stack 120, the grading layer 140 is epitaxially grown on the top surface of the absorption layer 130, and the blocking layer 150 is epitaxially grown on the top surface of the grading layer 140. The blocking layer 150 is etched to expose the window region 141 of the top surface of the grading layer 140, which serves as an etching stop. A window layer is then epitaxially regrown on the top surface of the blocking layer 150 and on the window region 141 of the top surface of the grading layer 140. The window layer is etched to form the window mesa 160 and to expose the top surface of the blocking layer 150 with exception of a window region 151 of the top surface of the blocking layer 150.

With reference to FIG. 2, a method of fabricating the APD semiconductor body 200 can be incorporated in various embodiments of a method of fabricating an APD. The APD semiconductor body 200 is fabricated by a method incorporating the method of fabricating the PIN-photodiode semiconductor body 100. To fabricate the APD semiconductor body 200, the layer stack 220 is epitaxially grown on the top surface of the substrate 110 in a series of steps. As a first step, the first buffer layer 121 is epitaxially grown. Then, the second buffer layer 222 is epitaxially grown on the top surface of the first buffer layer 121, the multiplication layer 223 is epitaxially grown on the top surface of the second buffer layer 222, and the field-control layer 224 is epitaxially grown on the top surface of the multiplication layer 223.

With reference to FIGS. 3 and 4, the PIN photodiode 300 and the APD 400 are fabricated by methods incorporating the methods of fabricating the PIN-photodiode semiconductor body 100 and the APD semiconductor body 200, respectively. To fabricate the PIN photodiode 300 and the APD 400, the capping layer 370 is epitaxially regrown on a top surface of the window layer, prior to etching the window mesa 160. After the window mesa 160 is etched, the antireflective layer 380 is deposited on the top surface of the capping layer 370, on the side surface of the window mesa 160, and on the top surface of the blocking layer 150 with exception of the window region 151 of the top surface of the blocking layer 150. The antireflective layer 380 is then etched to expose the contact region 371 of the top surface of the capping layer 370. The top contact 390 is deposited on the contact region 371 of the top surface of the capping layer 370, and the bottom contact 391 is deposited on the bottom surface of the substrate 110.

With reference to FIGS. 5 and 6, the PIN photodiode 500 and the APD 600 are fabricated by methods incorporating the methods of fabricating the PIN-photodiode semiconductor body 100 and the APD semiconductor body 200, respectively. To fabricate the PIN photodiode 500 and the APD 600, the capping layer 370 is epitaxially regrown on the top surface of the window layer and is etched to form a capping ring 570 on a ring-shaped capping region 561 of the top surface of the window mesa 160, prior to etching the window mesa 160. After the window mesa 160 is etched, the antireflective layer 580 is deposited on the top surface of the capping ring 570, on the top surface of the window mesa 160 with exception of the capping region 561 of the top surface of the window mesa 160, on the side surface of the window mesa 160, and on the top surface of the blocking layer 150 with exception of the window region 151 of the top surface of the blocking layer 150. The antireflective layer 580 is then etched to expose the top surface of the capping ring 570. The top contact 590 is deposited on the top surface of the capping ring 570, and the bottom contact 391 is deposited on the bottom surface of the substrate 110.

With reference to FIGS. 7 and 8, the PIN photodiode 700 and the APD 800 are fabricated by methods incorporating the methods of fabricating the PIN photodiode 300 and the APD 400, respectively. To fabricate the PIN photodiode 700 and the APD 800, an additional step is included in epitaxially growing the layer stacks 120 and 220, respectively. The DBR layer 725 is epitaxially grown prior to epitaxially growing the first buffer layer 121.

With reference to FIG. 9, the PIN photodiode 900 is fabricated by a method incorporating the method of fabricating the PIN-photodiode semiconductor body 100. To fabricate the PIN photodiode 900, the capping layer 370 is epitaxially regrown on the top surface of the window layer, prior to etching the window mesa 160. After the window mesa 160 is etched, the blocking layer 150, the grading layer 140, the absorption layer 130, and the top part of the layer stack 120 are etched to form the lower mesa 993 and to expose the top surface of the bottom part of the layer stack 120. The antireflective layer 980 is then deposited on the top surface of the capping layer 370, on the side surface of the window mesa 160, on the top surface of the blocking layer 150 with exception of the window region 151 of the top surface of the blocking layer 150, on the side surface of the lower mesa 993, and on the top surface of the bottom part of the layer stack 120. The antireflective layer 980 is etched to expose the contact region 371 of the top surface of the capping layer 370 and the contact region 926 of the top surface of the bottom part of the layer stack 120. The top contact 390 is deposited on the contact region 371 of the top surface of the capping layer 370, and the bottom contact 991 is deposited on the contact region 926 of the top surface of the bottom part of the layer stack 120.

With reference to FIG. 10, the PIN photodiode 1000 is fabricated by a method incorporating the method of fabricating the PIN photodiode 900. To fabricate the photodiode 1000, the implant region 1081 is formed by implanting ions into the blocking layer 150, the grading layer 140, and the absorption layer 130, at the periphery of the lower mesa 993, prior to depositing the antireflective layer 980.

With reference to FIG. 11, the PIN photodiode 1100 is fabricated by a method incorporating the method of fabricating the PIN-photodiode semiconductor body 100. To fabricate the PIN photodiode 1100, the capping layer 370 is epitaxially regrown on the top surface of the window layer, prior to etching the window mesa 160. After the window mesa 160 is etched, the antireflective layer 380 is deposited on the top surface of the capping layer 370, on the side surface of the window mesa 160, and on the top surface of the blocking layer 150 with exception of the window region 151 of the top surface of the blocking layer 150. The blocking layer 150, the grading layer 140, the absorption layer 130, and the top part of the layer stack 120 are etched to form the lower mesa 993. The passivation layer 1182 is then deposited on the side surface of the lower mesa 993, and on the top surface of the bottom part of the layer stack 120. In some instances, the step of depositing the antireflective layer 380 may be omitted, and the passivation layer 1182 may be deposited on the top surface of the capping layer 370, on the side surface of the window mesa 160, and on the top surface of the blocking layer 150 with exception of the window region 151 of the top surface of the blocking layer 150, as well as on the side surface of the lower mesa 993, and on the top surface of the bottom part of the layer stack 120. The antireflective layer 380 or, in some instances, the passivation layer 1182 is then etched to expose the contact region 371 of the top surface of the contact layer 370, and the passivation layer 1182 is etched to expose the contact region 926 of the top surface of the bottom part of the layer stack 120. The top contact 390 is deposited on the contact region 371 of the top surface of the capping layer 370, and the bottom contact 991 is deposited on the contact region 926 of the top surface of the bottom part of the layer stack 120.

With reference to FIG. 12, the PIN photodiode 1200 is fabricated by a method incorporating the method of fabricating the PIN photodiode 1100. To fabricate the PIN photodiode 1200, the implant region 1081 is formed by implanting ions into the blocking layer 150, the grading layer 140, and the absorption layer 130, at a periphery of the lower mesa 993, prior to depositing the passivation layer 1182.

With reference to FIGS. 13 and 14, the PIN photodiode 1300 and the APD 1400 are fabricated by methods incorporating the methods of fabricating the PIN-photodiode semiconductor body 100 and the APD semiconductor body 200, respectively. To fabricate the PIN photodiode 1300 and the APD 1400, the capping layer 370 is epitaxially regrown on the top surface of the window layer, prior to etching the window mesa 160. After the window mesa 160 is etched, the antireflective layer 1380 is deposited on the bottom surface of the substrate 110. The antireflective layer 1380 is then etched to expose the contact region 1311 of the bottom surface of the substrate 110. The reflective top contact 1390 is deposited on the top surface of the capping layer 370, and the bottom contact 1391 is deposited on the contact region 1311 of the bottom surface of the substrate 110.

With reference to FIGS. 15 and 16, the PIN photodiode 1500 and the APD 1600 are fabricated by methods incorporating the methods of fabricating the PIN photodiode 1300 and the APD 1400, respectively. To fabricate the PIN photodiode 1500 and the APD 1600, the bottom surface of the substrate 110 is etched to form the microlens 1512, prior to depositing the antireflective layer 1380.

The steps of the embodiments of a method of fabricating a photodiode described heretofore are carried out using conventional techniques, which will not be described in detail herein, as they are well-known to those skilled in the art. Epitaxial growth of the layer stacks 120 and 220, the absorption layer 130, the grading layer 140, and the blocking layer 150, and epitaxial regrowth of the window layer and the capping layer 370 are, preferably, performed by metal-organic chemical vapor deposition (MOCVD) or by molecular beam epitaxy (MBE). Etching of the antireflective layers 380, 580, 980, and 1380, the window layer, the blocking layer 150, the grading layer 140, the absorption layer 130, the top part of the layer stack 120, and the substrate 110 is, preferably, performed by wet or dry chemical etching in a photolithography process. Deposition of the antireflective layers 380, 580, 980, and 1380, and the passivation layer 1182 is, preferably, performed by chemical vapor deposition (CVD). Deposition of the top contacts 390 and 590, the reflective top contact 1390, and the bottom contacts 391, 991, and 1391 is, preferably, performed by thermal evaporation, electron-beam evaporation, or sputtering, in a photolithography lift-off process. The implant region 1081 is formed by ion implantation.

Of course, numerous other embodiments may be envisaged without departing from the spirit and scope of the invention.

What is claimed:
1. A photodiode comprising:
a substrate of semiconductor material;
a layer stack, disposed on a top surface of the substrate, wherein the layer stack includes a first buffer layer of extrinsic semiconductor material of a first conductivity type, for accommodating lattice mismatch;
an absorption layer of intrinsic semiconductor material, for absorbing light to generate current carriers, disposed on a top surface of the layer stack;
a grading layer of intrinsic semiconductor material, for facilitating current flow, disposed on a top surface of the absorption layer;
a blocking layer of extrinsic semiconductor material of the first conductivity type, for inhibiting current flow, disposed on a top surface of the grading layer with exception of a window region of the top surface of the grading layer, wherein the window region of the top surface of the grading layer is smaller in area than the top surface of the grading layer; and
a window mesa of extrinsic semiconductor material of a second conductivity type, for transmitting light to the absorption layer, disposed only on a window region of a top surface of the blocking layer and on the window region of the top surface of the grading layer, wherein the window region of the top surface of the blocking layer is smaller in area than the top surface of the blocking layer.

2. The photodiode of claim 1 wherein the layer stack consists of the first buffer layer.

3. The photodiode of claim 1 wherein the layer stack further includes:
a second buffer layer of extrinsic semiconductor material of the first conductivity type, for accommodating lattice mismatch, disposed on a top surface of the first buffer layer;
a multiplication layer of semiconductor material, for multiplying current carriers in an avalanche multiplication process, disposed on a top surface of the second buffer layer; and
a field-control layer of extrinsic semiconductor material of the second conductivity type, for controlling an electric field in the multiplication layer, disposed on a top surface of the multiplication layer.

4. The photodiode of claim 1 further comprising a capping layer of extrinsic semiconductor material of the second conductivity type, for ohmic contacting, disposed on a top surface of the window mesa.

5. The photodiode of claim 4 further comprising:
an antireflective layer of insulator material, for inhibiting reflection of light, disposed on a top surface of the capping layer with exception of a contact region of the top surface of the capping layer, on a side surface of the window mesa, and on the top surface of the blocking layer with exception of the window region of the top surface of the blocking layer;
a top contact of metallic material, disposed on the contact region of the top surface of the capping layer; and
a bottom contact of metallic material, disposed on a bottom surface of the substrate.

6. The photodiode of claim 1 further comprising:
a capping ring of extrinsic semiconductor material of the second conductivity type, for ohmic contacting, disposed on a capping region of a top surface of the window mesa;
an antireflective layer of insulator material, for inhibiting reflection of light, disposed on the top surface of the window mesa with exception of the capping region of the top surface of the window mesa, on a side surface of the window mesa, and on the top surface of the blocking layer with exception of the window region of the top surface of the blocking layer;
a top contact of metallic material, disposed on a top surface of the capping ring; and
a bottom contact of metallic material, disposed on a bottom surface of the substrate.

7. The photodiode of claim 1 wherein the layer stack further includes a distributed Bragg reflector (DBR) layer of extrinsic semiconductor material of the first conductivity type, for reflecting light toward the absorption layer, wherein the first buffer layer is disposed on a top surface of the DBR layer.

8. The photodiode of claim 1 further comprising a lower mesa including the blocking layer, the grading layer, the absorption layer, and a top part of the layer stack.

9. The photodiode of claim 4 further comprising:
a lower mesa including the blocking layer, the grading layer, the absorption layer, and a top part of the layer stack;
an antireflective layer of insulator material, for inhibiting reflection of light, disposed on a top surface of the capping layer with exception of a contact region of the top surface of the capping layer, on a side surface of the window mesa, on the top surface of the blocking layer with exception of the window region of the top surface of the blocking layer, on a side surface of the lower mesa, and on a top surface of a bottom part of the layer stack with exception of a contact region of the top surface of the bottom part of the layer stack;
a top contact of metallic material, disposed on the contact region of the top surface of the capping layer; and
a bottom contact of metallic material, disposed on the contact region of the top surface of the bottom part of the layer stack.

10. The photodiode of claim 8 further comprising an implant region, for inhibiting current flow, disposed at a periphery of the lower mesa in the blocking layer, the grading layer, and the absorption layer.

11. The photodiode of claim 4 further comprising:
a lower mesa including the blocking layer, the grading layer, the absorption layer, and a top part of the layer stack;
an antireflective layer of insulator material, for inhibiting reflection of light, disposed on a top surface of the capping layer with exception of a contact region of the top surface of the capping layer, on a side surface of the window mesa, and on the top surface of the blocking layer with exception of the window region of the top surface of the blocking layer;
a passivation layer of insulator material, for passivating exposed surfaces, disposed on a side surface of the lower mesa, and on a top surface of a bottom part of the layer stack with exception of a contact region of the top surface of the bottom part of the layer stack;
a top contact of metallic material, disposed on the contact region of the top surface of the capping layer; and
a bottom contact of metallic material, disposed on the contact region of the top surface of the bottom part of the layer stack.

12. The photodiode of claim 4 further comprising:
an antireflective layer of insulator material, for inhibiting reflection of light, disposed on a bottom surface of the substrate with exception of a contact region of the bottom surface of the substrate;
a reflective top contact of metallic material, for reflecting light toward the absorption layer, disposed on the top surface of the capping layer;
a bottom contact of metallic material, disposed on the contact region of the bottom surface of the substrate.

13. The photodiode of claim 12 wherein the substrate includes a microlens, for focusing light toward the absorption layer, disposed on the bottom surface of the substrate.

14. A method of fabricating a photodiode comprising steps of:
a) providing a substrate of semiconductor material;
b) epitaxially growing a layer stack on a top surface of the substrate, wherein epitaxially growing the layer stack includes epitaxially growing a buffer layer of extrinsic semiconductor material of a first conductivity type, for accommodating lattice mismatch;
c) epitaxially growing an absorption layer of intrinsic semiconductor material, for absorbing light to generate current carriers, on a top surface of the layer stack;
d) epitaxially growing a grading layer of intrinsic semiconductor material, for facilitating current flow, on a top surface of the absorption layer;
e) epitaxially growing a blocking layer of extrinsic semiconductor material of the first conductivity type, for inhibiting current flow, on a top surface of the grading layer;
f) etching the blocking layer to expose a window region of the top surface of the grading layer, wherein the window region of the top surface of the grading layer is smaller in area than the top surface of the grading layer;
g) epitaxially regrowing a window layer of extrinsic semiconductor material of a second conductivity type on a top surface of the blocking layer and on the window region of the top surface of the grading layer; and
h) etching the window layer to form a window mesa, for transmitting light to the absorption layer, and to expose the top surface of the blocking layer with exception of a window region of the top surface of the blocking layer, wherein the window region of the top surface of the blocking layer is smaller in area than the top surface of the blocking layer, such that the window mesa is disposed only on the window region of the top surface of the blocking layer and on the window region of the top surface of the grading layer.

15. The method of claim 14 wherein step b) further includes:
epitaxially growing a second buffer layer of extrinsic semiconductor material of the first conductivity type, for accommodating lattice mismatch, on a top surface of the first buffer layer;
epitaxially growing a multiplication layer of semiconductor material, for multiplying current carriers in an avalanche multiplication process, on a top surface of the second buffer layer; and
epitaxially growing a field-control layer of extrinsic semiconductor material of the second conductivity type, for controlling an electric field in the multiplication layer, on a top surface of the multiplication layer.

16. The method of claim 14 further comprising a step of epitaxially regrowing a capping layer of extrinsic semiconductor material of the second conductivity type, for ohmic contacting, on a top surface of the window layer.

17. The method of claim 16 further comprising steps of:
depositing an antireflective layer of insulator material, for inhibiting reflection of light, on a top surface of the capping layer, on a side surface of the window mesa, and on the top surface of the blocking layer with exception of the window region of the top surface of the blocking layer;
etching the antireflective layer to expose a contact region of the top surface of the capping layer;
depositing a top contact of metallic material on the contact region of the top surface of the capping layer; and
depositing a bottom contact of metallic material on a bottom surface of the substrate.

18. The method of claim 16 further comprising steps of:
etching the capping layer to form a capping ring, for ohmic contacting, on a capping region of the top surface of the window mesa;
depositing an antireflective layer of insulator material, for inhibiting reflection of light, on a top surface of the capping ring, on a top surface of the window mesa with exception of the capping region of the top surface of the window mesa, on a side surface of the window mesa, and on the top surface of the blocking layer with exception of the window region of the top surface of the blocking layer;
etching the antireflective layer to expose the top surface of the capping ring;
depositing a top contact of metallic material on the top surface of the capping ring; and
depositing a bottom contact of metallic material on a bottom surface of the substrate.

19. The method of claim 14 wherein step b) further includes epitaxially growing a distributed Bragg reflector (DBR) layer of extrinsic semiconductor material of the first conductivity type, for reflecting light toward the absorption layer, prior to epitaxially growing the first buffer layer on a top surface of the DBR layer.

20. The method of claim 14 further comprising a step of etching the blocking layer, the grading layer, the absorption layer, and a top part of the layer stack to form a lower mesa and to expose a top surface of a bottom part of the layer stack.

21. The method of claim 16 further comprising steps of:
etching the blocking layer, the grading layer, the absorption layer, and a top part of the layer stack to form a lower mesa and to expose a top surface of a bottom part of the layer stack;
depositing an antireflective layer of insulator material, for inhibiting reflection of light, on a top surface of the capping layer, on a side surface of the window mesa, on the top surface of the blocking layer with exception of the window region of the top surface of the blocking layer, on a side surface of the lower mesa, and on the top surface of the bottom part of the layer stack;
etching the antireflective layer to expose a contact region of the top surface of the capping layer and a contact region of the top surface of the bottom part of the layer stack;
depositing a top contact of metallic material on the contact region of the top surface of the capping layer; and
depositing a bottom contact of metallic material on the contact region of the top surface of the bottom part of the layer stack.

22. The method of claim 20 further comprising a step of implanting ions into the blocking layer, the grading layer, and the absorption layer to form an implant region, for inhibiting current flow, at a periphery of the lower mesa in the blocking layer, the grading layer, and the absorption layer.

23. The method of claim 16 further comprising steps of:
depositing an antireflective layer of insulator material, for inhibiting reflection of light, on a top surface of the capping layer, on a side surface of the window mesa, and on the top surface of the blocking layer with exception of the window region of the top surface of the blocking layer;
etching the blocking layer, the grading layer, the absorption layer, and a top part of the layer stack to form a lower mesa and to expose a top surface of a bottom part of the layer stack;
depositing a passivation layer of insulator material, for passivating exposed surfaces, on a side surface of the lower mesa, and on the top surface of the bottom part of the layer stack;
etching the antireflective layer to expose a contact region of the top surface of the capping layer;
etching the passivation layer to expose a contact region of the top surface of the bottom part of the layer stack;
depositing a top contact of metallic material on the contact region of the top surface of the capping layer; and
depositing a bottom contact of metallic material on the contact region of the top surface of the bottom part of the layer stack.

24. The method of claim 16 further comprising steps of:
depositing an antireflective layer of insulator material, for inhibiting reflection of light, on a bottom surface of the substrate;
etching the antireflective layer to expose a contact region on the bottom surface of the substrate;
depositing a reflective top contact of metallic material, for reflecting light toward the absorption layer, on a top surface of the capping layer; and
depositing a bottom contact of metallic material on the contact region of the bottom surface of the substrate.

25. The method of claim 24 further comprising a step of etching the bottom surface of the substrate to form a microlens, for focusing light toward the absorption layer.

26. The photodiode of claim 1, wherein the blocking layer is epitaxially grown on the top surface of the grading layer and etched to expose the window region of the top surface of the grading layer, and wherein the window mesa is etched from a window layer epitaxially regrown on the top surface of the blocking layer and on the window region of the top surface of the grading layer.

27. The photodiode of claim 1, wherein the window mesa has a lateral extent smaller than a lateral extent of the photodiode and smaller than a lateral extent of the blocking layer.

28. The photodiode of claim 27, wherein the window mesa is substantially cylindrical and has a first diameter smaller than the lateral extent of the photodiode and smaller than the lateral extent of the blocking layer, wherein the window region of the top surface of the grading layer is substantially circular and has a second diameter smaller than the first diameter, and wherein the window region of the top surface of the blocking layer is substantially ring-shaped, and has an inner diameter substantially equal to the second diameter and an outer diameter substantially equal to the first diameter.

* * * * *